US007006645B2

(12) United States Patent
Fujita et al.

(10) Patent No.: US 7,006,645 B2

(45) Date of Patent: Feb. 28, 2006

(54) AUDIO REPRODUCTION APPARATUS

(75) Inventors: Shinichi Fujita, Hamamatsu (JP); Hironari Kawai, Hamamatsu (JP)

(73) Assignee: Yamaha Corporation, Hamamatsu (JP)

(*) Notice: Subject to any disclaimer, the term of this patent is extended or adjusted under 35 U.S.C. 154(b) by 0 days.

(21) Appl. No.: 10/897,280

(22) Filed: Jul. 22, 2004

(65) Prior Publication Data

US 2004/0264717 A1 Dec. 30, 2004

Related U.S. Application Data

(63) Continuation-in-part of application No. 10/621,910, filed on Jul. 17, 2003, now abandoned.

(30) Foreign Application Priority Data

| | | |
|---|---|---|
| Jul. 19, 2002 | (JP) | 2002-210528 |
| Jul. 24, 2002 | (JP) | 2002-215588 |
| Jul. 24, 2003 | (JP) | 2003-201321 |

(51) Int. Cl.

| | |
|---|---|
| ***H04R 5/00*** | (2006.01) |
| ***H04R 5/02*** | (2006.01) |
| ***H03G 3/00*** | (2006.01) |
| ***H03F 21/00*** | (2006.01) |
| ***H02B 1/00*** | (2006.01) |

(52) U.S. Cl. .......................... 381/307; 381/18; 381/61; 381/123; 381/120; 381/300

(58) Field of Classification Search ............ 381/18–22, 381/307, 300, 123, 120, 61, 104–107
See application file for complete search history.

(56) References Cited

U.S. PATENT DOCUMENTS

| | | | | |
|---|---|---|---|---|
| 4,953,213 | A * | 8/1990 | Tasaki et al. | 381/307 |
| 5,177,798 | A * | 1/1993 | Ohsawa | 381/18 |
| 5,199,075 | A * | 3/1993 | Fosgate | 381/307 |
| 5,680,464 | A * | 10/1997 | Iwamatsu | 381/18 |
| 6,332,026 | B1 * | 12/2001 | Kuusama et al. | 381/17 |
| 6,650,755 | B1 * | 11/2003 | Vaudrey et al. | 381/18 |

FOREIGN PATENT DOCUMENTS

| | | |
|---|---|---|
| JP | 06-189399 | 7/1994 |
| JP | 10-200968 | 7/1998 |

* cited by examiner

*Primary Examiner*—Laura A. Grier
(74) *Attorney, Agent, or Firm*—Pillsbury Winthrop Shaw Pittman LLP

(57) ABSTRACT

A first selector switch outputs a second audio signal of m channel corresponding to a selected second zone to a power amplifier of the m channel and a second selector switch couples output of the power amplifier of the m channel to a speaker terminal for the selected second zone whereby an audio signal can be supplied to either one of a plurality of second zones. In one aspect of the invention, a first selector switch outputs a second audio signal of m channel corresponding to a selected second zone to a power amplifier of the m channel determined by a control section and a second selector switch couples output of the m channel determined by the control section to a speaker terminal for the selected second zone whereby an audio signal can be supplied to one or more zones among plural second zones.

5 Claims, 24 Drawing Sheets

PRIOR ART

PRIOR ART

PRIOR ART

AUDIO REPRODUCTION APPARATUS

This is a continuation in part of application Ser. No. 10/621,910, filed Jul. 17, 2003, now abandoned.

BACKGROUND OF THE INVENTION

The present invention relates generally to audio reproduction apparatus having a multichannel audio reproduction function, and more particularly to an improved audio reproduction apparatus which can switch a portion of multichannel power amplifiers provided for a first zone to one or more power amplifiers for a second zone. The present invention also relates to an improved audio reproduction apparatus with the multichannel audio reproduction function which can perform ON/OFF control on output to two groups of speaker output terminals independently of each other.

As a form multichannel audio reproduction system, there have been popularly employed, in recent years, digital surround systems which use audio compression techniques, such as Dolby (registered trademark) Digital, DTS (registered trademark: an acronym for Digital Theater System) and AAC (Advanced Audio Coding) techniques.

Recently, multizone audio reproduction systems have also began into wide use, which are designed to deliver audio signals to a plurality of rooms. Heretofore, in cases where a single audio reproduction apparatus, having the multichannel audio reproduction function, is used to perform ON/OFF control on delivery of audio signals to two zones independently of each other, it has been necessary to secure in advance a portion (one or more but not all) of multichannel power amplifiers provided for a first zone (hereinafter also called "first-zone multichannel power amplifiers") for use as one or more multichannel power amplifiers for a second zone (hereinafter also called "second-zone multichannel power amplifiers"). Hereinafter, delivery of audio signals to the second zone different from the first zone will be referred to as "Zone-2 audio reproduction".

FIG. 15 is a block diagram illustrating a setup of a conventional audio reproduction apparatus of a type that performs the multichannel audio reproduction function and Zone-2 audio reproduction function. The audio reproduction apparatus of FIG. 15 is intended mainly for multichannel audio reproduction function. When analog audio signals ALIN and ARIN of two channels are input to input terminals 1—1 and 1-2, an A/D converter 2 converts the input analog audio signals ALIN and ARIN into digital audio signals. The thus-converted digital audio signals are passed to a digital signal processor (hereinafter referred to as a "DSP") 4, where the audio signals are subjected to sound field processing as may be necessary. However, a further description of the input signals to input terminals 1—1 and 1-2 is omitted because these input signals are not multichannel audio inputs to be processed in accordance with the basic principles of the present invention.

When a digital sound signal DIN, compression-coded by the Dolby Digital, DTS or AAC technique, is supplied via an input terminal 1-3 and selector 3 to the DSP 4, the DSP 4 decompression-decodes the input compression-coded digital sound signal DIN by means of an internal decoder 401, to thereby generate various audio signals, i.e. main left and right signals L and R, rear left and right signals RL and RR, center signal C, rear center signal RC and subwoofer (low frequency) signal LFE.

The main left and right signals L and R and rear left and right signals RL and RR, output from a sound field processing section 402 of the DSP 4, are converted by a D/A converter 5 into analog signals, then passed via corresponding volume controls 6-1, 6-2 and 6-3, 6-4 to power amplifiers 7-1, 7-2 and 7-3, 7-4 for amplification, and then output through speaker terminals 8-1, 8-2 and 8-3, 8-4. Further, the subwoofer signal LFE, output from the sound field processing section 402 of the DSP 4, is converted by the D/A converter 5 into an analog signal, then passed to a corresponding volume control 6-7, and then output through a subwoofer output terminal 11.

When audio reproduction is not to be performed in the second zone, selector switches 9-1 and 9-2 are each caused to connect to a "Z1" (first-zone side) contact. In this case, the center signal C and rear center signal RC, output from the sound field processing section 402 of the DSP 4, are converted by the D/A converter 5 into analog signals, then passed, via corresponding volume controls 6-5 and 6—6 and selector switches 9-1 and 9-2, to power amplifiers 7-5 and 7-6 for amplification, and then output through speaker terminals 8-5 and 8-6, respectively.

When, on the other hand, the Zone-2 audio reproduction function is to be used or performed to deliver audio signals of two channels to the second zone, the selector switches 9-1 and 9-2 are each caused to connect to a Z2 (second-zone side) contact. In this case, analog audio signals Z2L and Z2R input to input terminals 1-4 and 1-5 are passed, via corresponding volume controls 6-8 and 6-9 and selector switches 9-1 and 9-2, to the power amplifiers 7-5 and 7-6 for amplification, and then output through the speaker terminals 8-5 and 8-6, respectively.

FIG. 16 is a plan view showing layout or arrangement of the speakers in the first zone Zone 1 for performing the multichannel audio reproduction and in the second zone Zone 2 for performing the two-channel audio reproduction. When the multichannel audio reproduction is to be performed in the first zone Zone 1, the main left and right signals L, R, rear left and right signals RL, RR, center signal C and rear center signal RC, output from the speaker terminals 8-1, 8-2, 8-3, 8-4, 8-5 and 8-6, are supplied to main speakers SP-L, SP-C, rear speakers SP-RL, SP-RR, center speaker SP-C and rear center speaker SP-RC, respectively. The subwoofer signal LFE, output from the subwoofer output terminal 11, is supplied to a subwoofer SP-SW provided with a built-in amplifier. In FIG. 16, each reference character U represents a test-listening position.

When, on the other hand, audio signals of two channels are to be delivered to the second zone for two-channel audio reproduction in the second zone, the audio signals Z2L and Z2R of the two channels, output from the speaker terminals 8-5 and 8-6, are supplied to the speakers SP-Z2L and SP-Z2R, respectively.

In the audio reproduction apparatus of FIG. 15, where the amplifiers 7-5 and 7-6 and speakers 8-5 and 8-6 are shared between the multichannel audio reproduction function and the Zone-2 audio reproduction function, if there is a likelihood of the Zone-2 audio reproduction function being used, it is necessary to previously connect the speakers SP-Z2L and SP-Z2R of the second zone Zone 2 with the speaker terminals 8-5 and 8-6 and connect each of the selector switches 9-1 and 9-2 to the Z2 contact, irrespective of whether or not the Zone-2 audio reproduction function is actually used in the second zone Zone 2. Therefore, even where the center speaker SP-C and rear center speaker SP-RC are positioned in the first zone Zone 1, the center and rear center signals C and RC are not supplied to these center and rear center speakers SP-C and SP-RC.

Namely, when the Zone-2 audio reproduction function is to be performed in the conventional audio reproduction apparatus having the multichannel audio reproduction function and if there can not be provided a specific number of power amplifiers corresponding to a necessary number of channels for the first zone Zone 1 plus a necessary number of channels for the second zone Zone 2, there arises a need to secure in advance a portion of the first-zone multichannel power amplifiers for use as one or more second-zone multichannel power amplifiers. Thus, the number of output channels of the first zone would come short, which would undesirably result in an insufficient multichannel audio reproduction effect in the first zone.

Recently, another type of multizone audio reproduction system has also become popular which are designed to deliver audio signals to a plurality of rooms using a single amplifier. In applications where the multizone audio reproduction function is to be performed using an audio reproduction apparatus, it has been known to provide an A group of main speakers in a first zone and a B group of main speakers in a second zone, and perform, via a main speaker changing switch of the audio reproduction apparatus, ON/OFF control on output to the A-group main speakers and output to the B-group main speakers independently of each other.

FIG. 26 is a block diagram illustrating a setup of such a conventional audio reproduction apparatus. When analog audio signals ALIN and ARIN of two channels are input to input terminals 1—1 and 1-2, an A/D converter 22 converts the input analog audio signals ALIN and ARIN into digital audio signals. The thus-converted digital audio signals are passed to a digital signal processor (DSP) 3, where the audio signals are subjected to sound field processing as may be necessary. When a digital sound signal DIN, compression-coded by the Dolby Digital, DTS or AAC technique, is input to an input terminal 1-3, the DSP 3 decompression-decodes the input compression-coded digital sound signal DIN by means of an internal decoder (not shown), to thereby generate various analog audio signals, i.e. main left and right signals L and R, rear left and right signals RL and RR, center signal C and subwoofer (low frequency) signal LFE.

When the DSP 3 is set in an OFF (or downmix) state (for two-channel audio reproduction), the main left and right signals L and R are output from the DSP 3, but, when the DSP 3 is set in an ON state (for multichannel audio reproduction), the main left and right signals L and R, rear left and right signals RL and RR, center signal C and subwoofer (low frequency) signal LFE are output from the DSP 3.

When audio reproduction is to be performed in the first zone, main speaker changing switches 16-1 and 16-2 are turned on. Thus, the main left and right signals L and R are amplified by power amplifiers 14-1 and 14-2, respectively, and then passed through the main speaker changing switches 16-1 and 16-2 to speaker output terminals 5-1 and 5-2 to be output therefrom. When multichannel audio reproduction is to be performed, the rear left and right signals RL, RR and center signal C, output from the DSP 3, are amplified by power amplifiers 14-3, 14-4 and 14-5, respectively, and then output from speaker output terminals 5-3, 5-4 and 5—5. Further, the subwoofer signal LFE output from the DSP 3 is output from a subwoofer output terminal 17. On the other hand, when audio signals are to be delivered to the second zone, main speaker changing switches 16-3 and 16-4 are turned on. Thus, the main left and right signals L and R, output from the DSP 3, are amplified by the power amplifiers 14-1 and 14-2, respectively, and then passed through the main speaker changing switches 16-3 and 16-4 to speaker output terminals 5-6 and 5-7 to be output therefrom.

FIG. 27 is a plan view showing layout or arrangement of the speakers in the first zone ZoneA capable of the multichannel audio reproduction and the speakers in the second zone ZoneB capable of the two-channel audio reproduction in the conventional audio reproduction apparatus of FIG. 20. In the figure, test-listening positions are each represented by reference character U. When the multichannel audio reproduction is to be performed in the first zone ZoneA, the main left and right signals L, R, rear left and right signals RL, RR and center signal C, output from the speaker terminals 5-1, 5-2, 5-3, 5-4 and 5—5, are supplied to main speakers SP-AL, SP-AR, rear speakers SP-RL, SP-RR and center speaker SP-C, respectively. The subwoofer signal LFE, output from the subwoofer output terminal 17, is supplied to a subwoofer SP-SW provided with a built-in amplifier. When, on the other hand, the audio signals of the two channels are to be delivered to the second zone ZoneB, the audio signals output from the speaker terminals 5-6 and 5-7 are supplied to the speakers SP-BL and SP-BR, respectively.

Namely, the conventional audio reproduction apparatus of FIG. 20 are constructed in such a manner that the output to the main speakers SP-AL and SP-AR of group A and the output to the main speakers SP-BL and SP-BR of group B can be subjected to ON/OFF control independently of each other; however, the conventional audio reproduction apparatus of FIG. 20 is constructed with no consideration as to whether the B-group speakers SP-BL and SP-BR are positioned in the first zone ZoneA or in the second zone ZoneB. Therefore, once the output to the A-group speakers SP-AL and SP-AR is turned off while the multichannel audio reproduction is being executed with the DSP 3 set in the ON state under the environment where the A-group speakers SP-AL and SP-AR are provided in the first zone ZoneA while the B-group speakers SP-BL and SP-BR are provided in the second zone ZoneB, there would arise a problem that only surround signals are reproduced in the first zone ZoneA. Another problem with the conventional audio reproduction apparatus of FIG. 20 is that, if the B-group speakers SP-BL and SP-BR are provided in the second zone ZoneB, no surround signal can be reproduced in the second zone ZoneB and thus no multichannel audio reproduction effect can be achieved in the second zone ZoneB.

SUMMARY OF THE INVENTION

In view of the foregoing, it is an object of the present invention to provide an audio reproduction apparatus with a multichannel audio reproduction function which achieves a sufficient multichannel audio reproduction effect even where there is a need to allocate a portion of multichannel power amplifiers of a first zone to a second zone.

The present invention provides an audio reproduction apparatus having: a first mode for performing multichannel audio reproduction to deliver first audio signals of n (n is an integral number in a range of $n \geqq 4$) channels from power amplifiers of the n channels to a first zone; and a second mode for performing multizone audio reproduction to deliver, from said power amplifier of m channel (m is an integral number in a range of $1 \leqq m < n$) not used for the multichannel audio reproduction, a second audio signal of the m channel to said second zone while performing multichannel audio reproduction to deliver said first audio signals of (n−m) channels from said power amplifiers of the (n−m) channels to said first zone, said audio reproduction apparatus comprising a digital signal processor that processes said first audio signals of the n channels and outputs the processed first audio signals to said power amplifiers of the n channels; a first selector switch which, in said first mode, outputs to said power amplifier of the m channel said first audio signal of the m channel corresponding to said power amplifier of the m channel from among said first audio channels of the n channels outputted by said digital signal processor, while, in said second mode, outputting said second audio signal of the m channel to said power amplifier of the m channel; and a second selector switch which, in said first mode, couples the output of said power amplifier of the m channel to a speaker terminal provided for said first zone, while, in said second mode, coupling the output of said power amplifier of the m channel to a speaker terminal provided for said second zone, wherein, in said second mode, said digital signal processor performs sound field correction on at least a portion of said first audio signals of the (n−m) channels so that a sound field of said first zone has a desired characteristic; said first selector switch outputs, in said second mode in which only one of a plurality of said second zones can be selected, said second audio signal of the m channel corresponding to said selected second zone to said power amplifier of the m channel; and said second selector switch couples, in said second mode, the output of said power amplifier of the m channel to a speaker terminal provided for said selected second zone.

According to the invention, since the first selector switch outputs the second audio signal of the m channel corresponding to the selected second zone to the power amplifier of the m channel and the second selector switch couples the output of the power amplifier of the m channel to the speaker terminal for the selected second zone, the audio signal can be supplied to either one of a plurality of the second zones.

The present invention also provides an audio reproduction apparatus having: a first mode for performing multichannel audio reproduction to deliver first audio signals of n (n is an integral number in a range of $n \geqq 4$) channels from power amplifiers of the n channels to a first zone; and a second mode for performing multizone audio reproduction to deliver, from said power amplifier of m channel (m is an integral number in a range of $1 \leqq m < n$) not used for the multichannel audio reproduction, a second audio signal of the m channel to said second zone while performing multichannel audio reproduction to deliver said first audio signals of (n−m) channels from said power amplifiers of the (n−m) channels to said first zone, said audio reproduction apparatus comprising:a digital signal processor that processes said first audio signals of the n channels and outputs the processed first audio signals to said power amplifiers of the n channels; a first selector switch which, in said first mode, outputs to said power amplifier of the m channel said first audio signal of the m channel corresponding to said power amplifier of the m channel from among said first audio channels of the n channels outputted by said digital signal processor, while, in said second mode, outputting said second audio signal of the m channel to said power amplifier of the m channel; a second selector switch which, in said first mode, couples the output of said power amplifier of the m channel to a speaker terminal provided for said first zone, while, in said second mode, coupling the output of said power amplifier of the m channel to a speaker terminal provided for said second zone; and a control section which, in said second mode in which one or more zones can be selected from among a plurality of said second zones, determines said power amplifier totaling the m channel corresponding to said selected second zone from among said power amplifiers of the n channels in accordance with a DSP program, wherein, in said second mode, said digital signal processor performs sound field correction on at least a portion of said first audio signals of the (n−m) channels so that a sound field of said first zone has a desired characteristic; said first selector switch outputs, in said second mode, said second audio signal of the m channel corresponding to said selected second zone to said power amplifier of the m channel which has been determined by said control section; and said second selector switch couples, in said second mode, the output of said power amplifier of the m channel which has been determined by said control section to a speaker terminal provided for said selected second zone.

According to this aspect of the invention, since the first selector switch outputs the second audio signal of the m channel corresponding to the selected second zone to the power amplifier of the m channel determined by the control section and the second selector switch connects the output of the m channel determined by the control section to the speaker terminal for the selected second zone, an audio signal can be supplied to one or more zones among plural second zones. Further, by providing the control section, a power amplifier to be allocated to the second zone, i.e., a speaker of the m channel which does not produce sound in the first zone, can be properly selected in accordance with the DSP program whereby a sound field suitable for the DSP program can be produced in the first zone.

The following will describe embodiments of the present invention, but it should be appreciated that the present invention is not limited to the described embodiments and various modifications of the invention are possible without departing from the basic principles of the invention. The scope of the present invention is therefore to be determined solely by the appended claims.

BRIEF DESCRIPTION OF THE DRAWINGS

For better understanding of the object and other features of the present invention, its preferred embodiments will be described hereinbelow in greater detail with reference to the accompanying drawings, in which.

DETAILED DESCRIPTION OF THE INVENTION

[First Embodiment]

Figure 1:
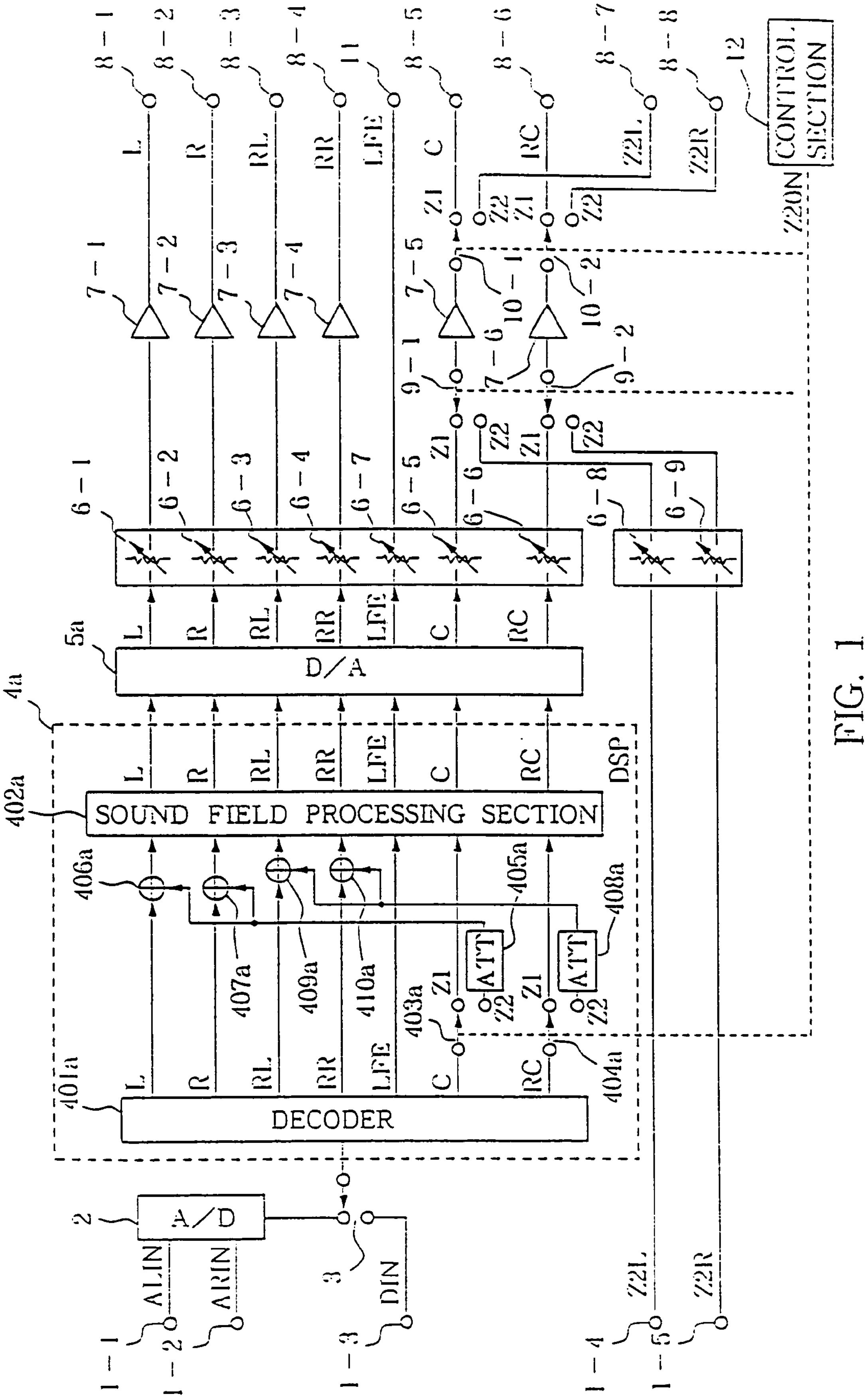
FIG. 1 is a block diagram showing a setup of an audio reproduction apparatus in accordance with a first embodiment of the present invention.

FIG. 1 is a block diagram showing a setup of an audio reproduction apparatus in accordance with a first embodiment of the present invention. The audio reproduction apparatus of FIG. 1 includes input terminals 1 (1—1, 1-2, 1-3, 1-4 and 1-5), an A/D converter 2, a selector 3, a DSP 4*a*, a D/A converter 5*a*, volume controls 6 (6-1, 6-2, 6-3, 6-4, 6-5, 6—6, 6-7, 6-8 and 6-9), power amplifiers 7 (7-1, 7-2, 7-3, 7-4, 7-5 and 7-6), speaker terminals 8 (8-1, 8-2, 8-3, 8-4, 8-5, 8-6, 8-7 and 8—8), first selector switches 9 (9-1 and 9-2), second selector switches 10 (10-1 and 10-2), a subwoofer output terminal 11, and a control section 12.

The power amplifiers 7 are provided in corresponding relation to n (n is an integral number equal to or greater than "4" ($n \geqq 4$); in the instant embodiment, n=6) channels. Of the n channels, m ($1 \leqq m < n$; in the instant embodiment, m=2) channels are used for the Zone-2 audio reproduction. When a digital sound signal DIN, compression-coded by the Dolby Digital, DTS or AAC, is supplied from the input terminal 1-3 via the selector 3, a decoder 401*a* of the DSP 4*a* decompression-decodes the input compression-coded digital sound signal DIN, to thereby generate various audio signals (first audio signals), i.e. main left and right signals L and R, rear left and right signals RL and RR, center signal C, rear center signal RC and subwoofer (low frequency) signal LFE.

The thus-generated audio signals are passed, via a sound processing section 402*a* for performing various sound field processing, to the D/A converter 5*a*, where the signals are converted into analog signals. The main left and right signals L, R and rear left and right signals RL, RR, output from the D/A converter 5*a*, are passed via the corresponding volume controls 6-1, 6-2 and 6-3, 6-4 to the power amplifiers 7-1, 7-2 and 7-3, 7-4 for amplification, and then output through the speaker terminals 8-1, 8-2 and 8-3, 8-4. The subwoofer signal LFE output from the D/A converter 5*a* is sent via the volume control 6-7 to the subwoofer output terminal 11.

In the instant embodiment, two channel analog audio signals ALIN and ARIN are treated as being outside of the present invention since these signals are not of multichannel souce. However, since there is a decoding technique which realizes a multichannel souce with an analog signal such as Dolby Prologic signal, such analog signal of multichannel source can be a source of the first audio signal and, in this case, such signal can be included in the scope of the present invention.

Figure 16:
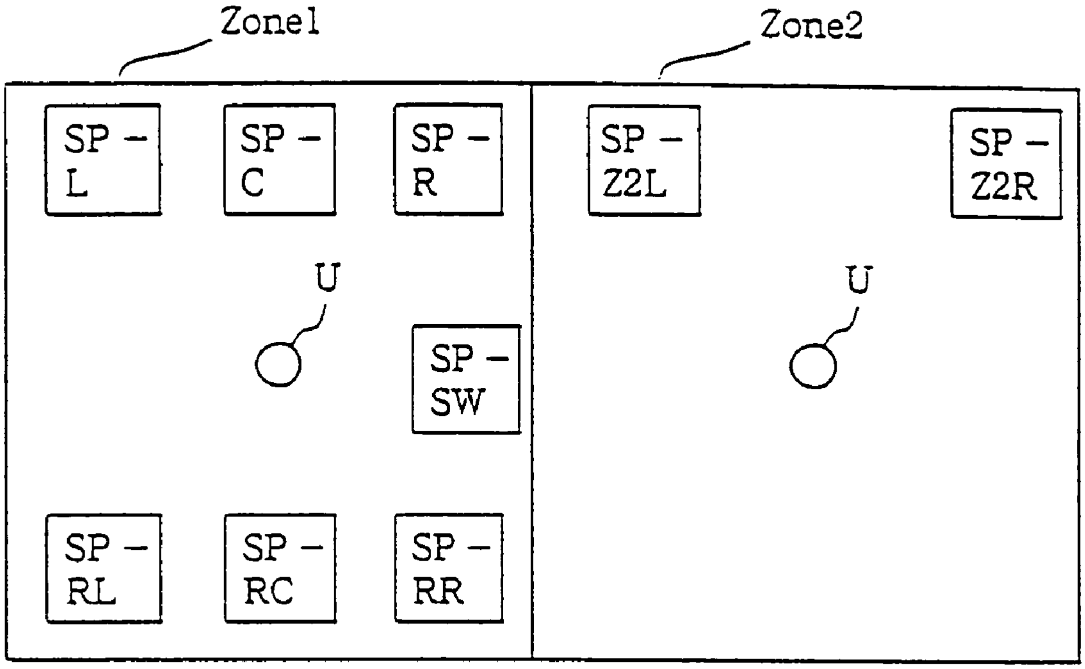
FIG. 16 is a plan view showing arrangement of speakers in a first zone for performing multichannel audio reproduction and in a second zone for performing two-channel audio reproduction.

In the instant embodiment, speakers are arranged in the first and second zones Zone 1 and Zone 2 in the same manner as shown in and described earlier in relation to FIG. 16. The speaker terminals 8-1, 8-2, 8-3, 8-4, 8-5 and 8-6 are connected to the main speakers SP-L, SPSP-C, rear speakers SP-RL, SP-RR, center speaker SP-C and rear center speaker SP-RC, respectively, of the first zone Zone 1. The subwoofer output terminal 11 is connected to a subwoofer SP-SW provided with a built-in amplifier.

Figure 2:
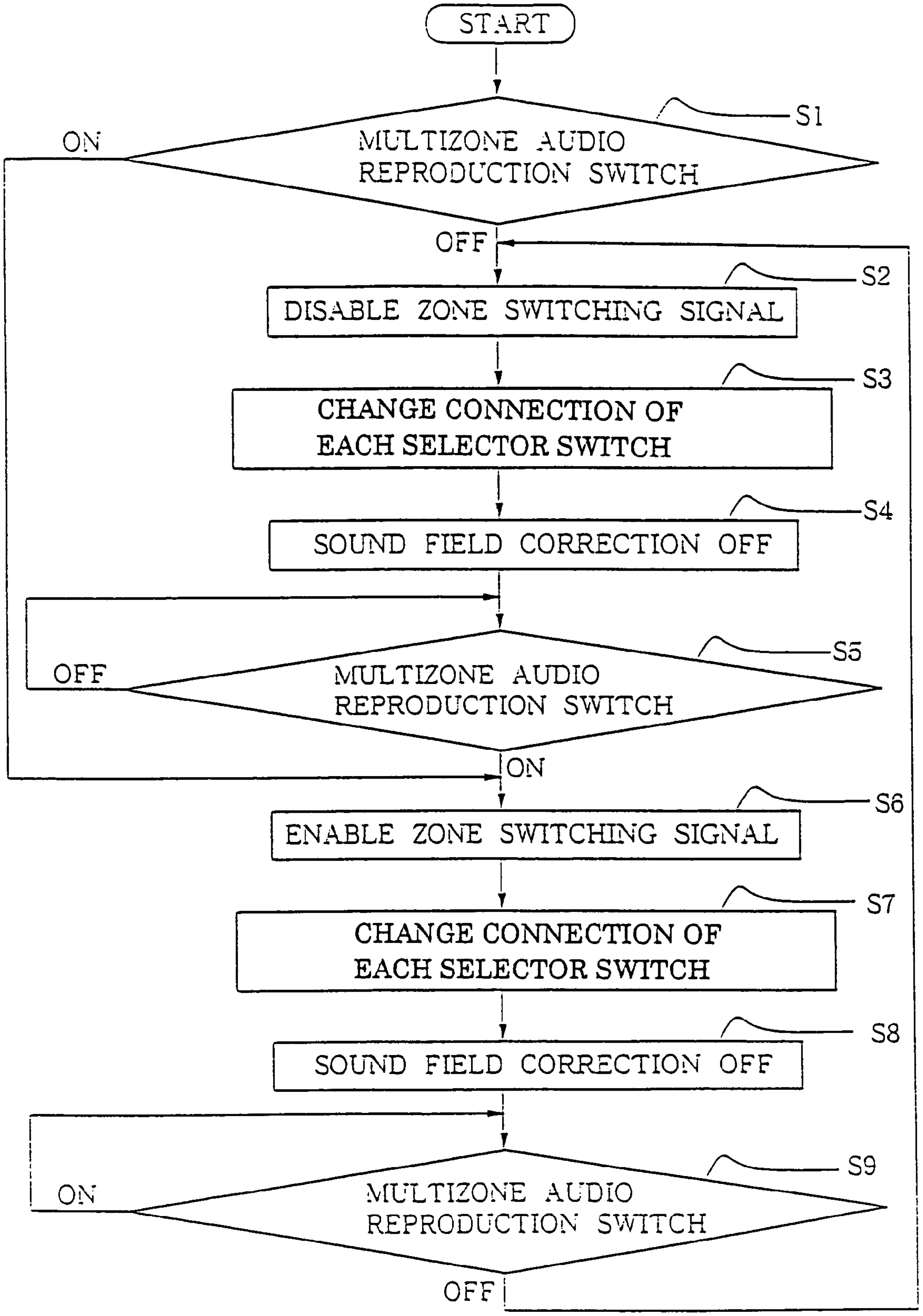
FIG. 2 is a flow chart showing operations performed by the first embodiment of the audio reproduction apparatus of FIG. 1 as the Zone-2 audio reproduction function is turned on and off.

FIG. 2 is a flow chart showing operations performed by the audio reproduction apparatus of FIG. 1 as the Zone-2 audio reproduction function is turned on and off. When the Zone-2 audio reproduction function is not to be used, a user turns off a Zone-2 audio reproduction switch (not shown) of the audio reproduction apparatus. If the Zone-2 audio reproduction switch is OFF as determined at step S1 of FIG. 2, the control section 12 invalidates or disables a zone switching signal Z2ON at step S2. Thus disabling the zone switching signal Z2ON causes each of the selector switches 9-1, 9-2, 10-1 and 10-2 to connect to a Z1 (first-zone side) contact, at step S3. Also, disabling the zone switching signal Z2ON switches each of switches 403*a* and 404*a* of the DSP 4*a* to connect to the Z1 contact, so that sound field correction to be later described is turned off at step S4.

Consequently, the center signal C and rear center signal RC, output from the D/A converter 5*a*, are sent via the corresponding volume controls 6-5 and 6—6 and selector switches 9-1 and 9-2, to the power amplifiers 7-5 and 7-6 for amplification, and the thus-amplified center signal C and rear center signal RC are then passed via the selector switches 10-1 and 10-2 to the speaker terminals 8-5 and 8-6 to be output therefrom. In this manner, 6.1-channel audio reproduction is performed in the first zone Zone 1.

When, on the other hand, the Zone-2 audio reproduction function is to be used to deliver audio signals of two channels to the second zone Zone 2, the user turns on the Zone-2 audio reproduction switch of the audio reproduction apparatus. If the Zone-2 audio reproduction switch is ON as determined at step S5 of FIG. 2, the control section 12 enables the zone switching signal Z2ON at step S6. Thus enabling the zone switching signal Z2ON causes each of the selector switches 9-1, 9-2, 10-1 and 10-2 to connect to the Z2 contact, at step S7. In this way, analog audio signals (second audio signals) Z2L and Z2R, input to the input terminals 1-4 and 1-5, are sent via the corresponding volume controls 6-8 and 6-9 and selector switches 9-1 and 9-2, to the power amplifiers 7-5 and 7-6 for amplification, and the thus-amplified signals are then passed via the selector switches 10-1 and 10-2 to the speaker terminals 8-7 and 8—8 to be output therefrom. Because the speaker terminals 8-7 and 8—8 are connected to the speakers SP-Z2L and SP-Z2R of the second zone Zone 2, 2-channel audio reproduction is executed in the second zone.

Also, in response to the enabling of the zone switching signal Z2ON, the switches 403*a* and 404*a* within the DSP 4*a* are caused to connect to the Z2 contact. Thus, in order to compensate for reduction in the multichannel audio reproduction effect due to stoppage of supply, to the speakers SP-C and SP-RC in the first zone Zone 1, of the center signal C and rear center signal RC, the sound field correction is performed on the main left and right signals L and R and rear left and right signals RL and RR to be supplied to the first zone Zone 1, at step S8.

For execution of 6.1-channel multichannel audio reproduction by the main speakers SP-L and SP-R, rear speakers SP-RL and SP-RR and subwoofer SP-SW, the instant embodiment is arranged to allocate and add the center signal C and rear center signal RC to the main left and right signals L, R and rear left and right signals RL, RR so that the center signal C and rear center signal RC are supplied together with the main left and right signals L, R and rear left and right signals RL, RR. Namely, because it is only necessary for the center signal C to be localized between the main left and right signals L and R, the center signal C may be allocated and added to the main left and right signals L and R. Similarly, because it is only necessary for the rear center signal RC to be localized between the rear left and right signals RL and RR, the rear center signal RC may be allocated and added to the rear left and right signals RL and RR.

When the sound field correction is to be executed at step S8, the center signal C output from the decoder 401*a* is passed via the switch 403*a* to an attenuator 405*a* for adjustment to an appropriate level, and then the level-adjusted center signal C is added to the main left and right signals L and R via adders 406*a* and 407*a*. Also, the rear center signal RC output from the decoder 401*a* is passed via the switch 404*a* to an attenuator 408*a* for adjustment to an appropriate level, and then the level-adjusted rear center signal RC is added to the rear left and right signals RL and RR via adders 409*a* and 410*a*. The main left and right signals L, R and rear left and right signals RL, RR, having been subjected to the sound field correction, are sent via the sound processing section 402*a* to the D/A converter 5*a* for conversion into analog signals, and the thus-converted analog signals are passed via the corresponding volume controls 6-1, 6-2 and 6-3, 6-4 to the power amplifiers 7-1, 7-2 and 7-3, 7-4 for amplification. Then, the thus-amplified analog signals are output through the speaker output terminals 8-1, 8-2 and 8-3, 8-4. Further, the subwoofer signal LFE, output from the audio processing section 402*a*, is converted into an analog signal by the D/A converter 5*a* and output via the subwoofer output terminal 11 after having been processed by the volume control 6-7.

Note that respective gains of the main left and right signals L and R, rear left and right signals RL and RR, center signal C and rear center signal RC are set for the sound field correction such that the sound fields in the first zone Zone 1 have desired characteristics.

Figure 15:
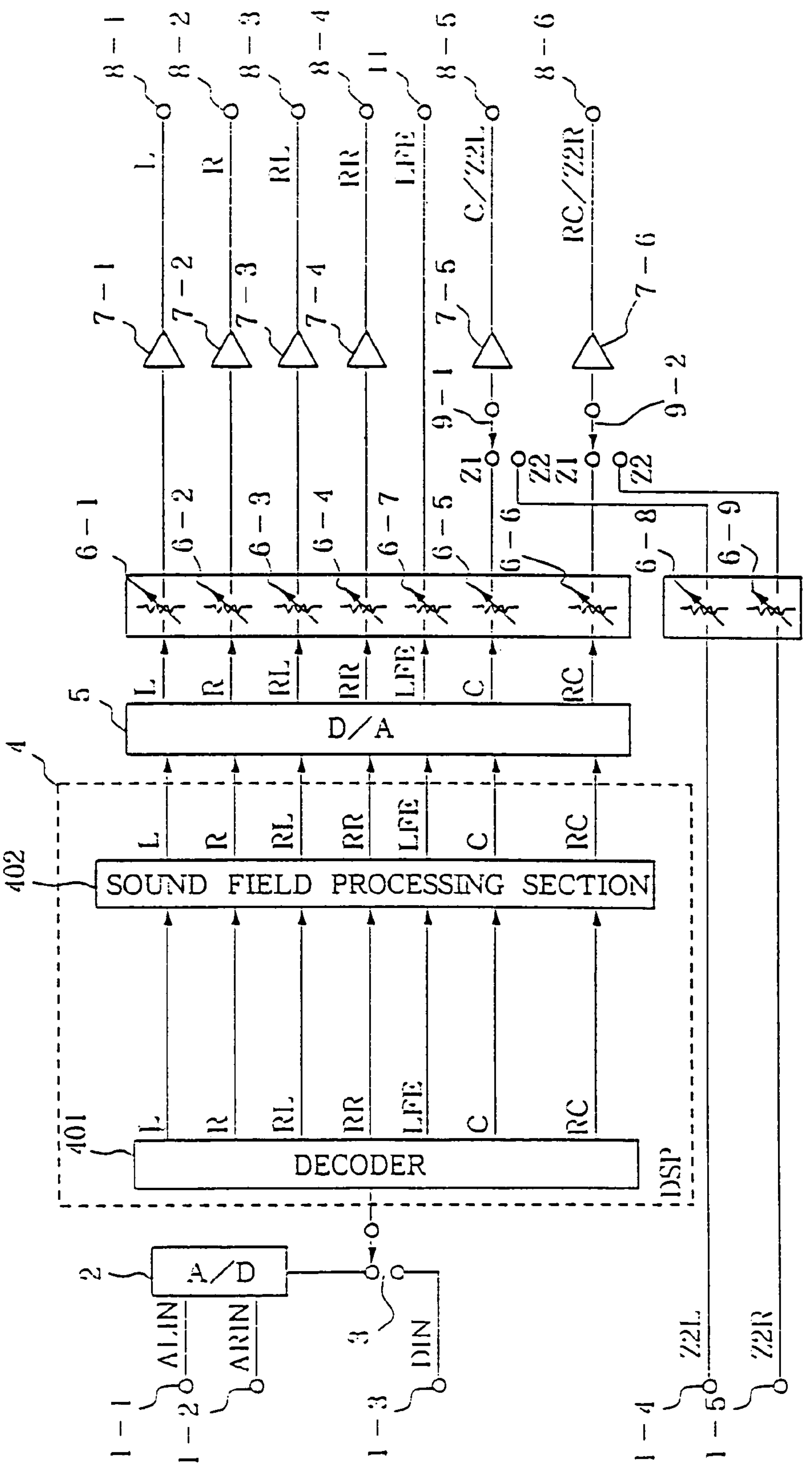
FIG. 15 is a block diagram illustrating a setup of a conventional audio reproduction apparatus.

Namely, the instant embodiment is constructed by adding the selector switches 10-1 and 10-2 and speaker terminals 8-7 and 8—8 to the basic structure of the conventional audio reproduction apparatus of FIG. 15. When no actual audio reproduction is to be executed in the second zone Zone 2, the selector switches 10-1 and 10-2 are each caused to connect to the Z1 contact, so that the center signal C and rear center signal RC can be supplied to the speakers SP-C and SP-RC of the first zone Zone 1 and thus the maximum multichannel audio reproduction effect can be obtained.

When, on the other hand, actual audio reproduction is to be actually executed in the second zone Zone 2, the sound field correction is performed by the DSP 4*a* on the main left and right signals L and R and rear left and right signals RL and RR, so that the instant embodiment can appropriately compensate for reduction in the multichannel audio reproduction effect in the first zone.

Note that, during the course of switching operations of the selector switches 9-1, 9-2, 10-1 and 10-2 and the switches 403*a* and 404*a* within the DSP 4*a* at steps S2 to S4 and S6 to S8 of FIG. 2, the instant embodiment performs further operations, for example, for turning off all outputs of the sound processing section 402*a*, so as to prevent undesired sounds from being produced inadvertently due to switching time differences etc.

[Second Embodiment]

Figure 3:
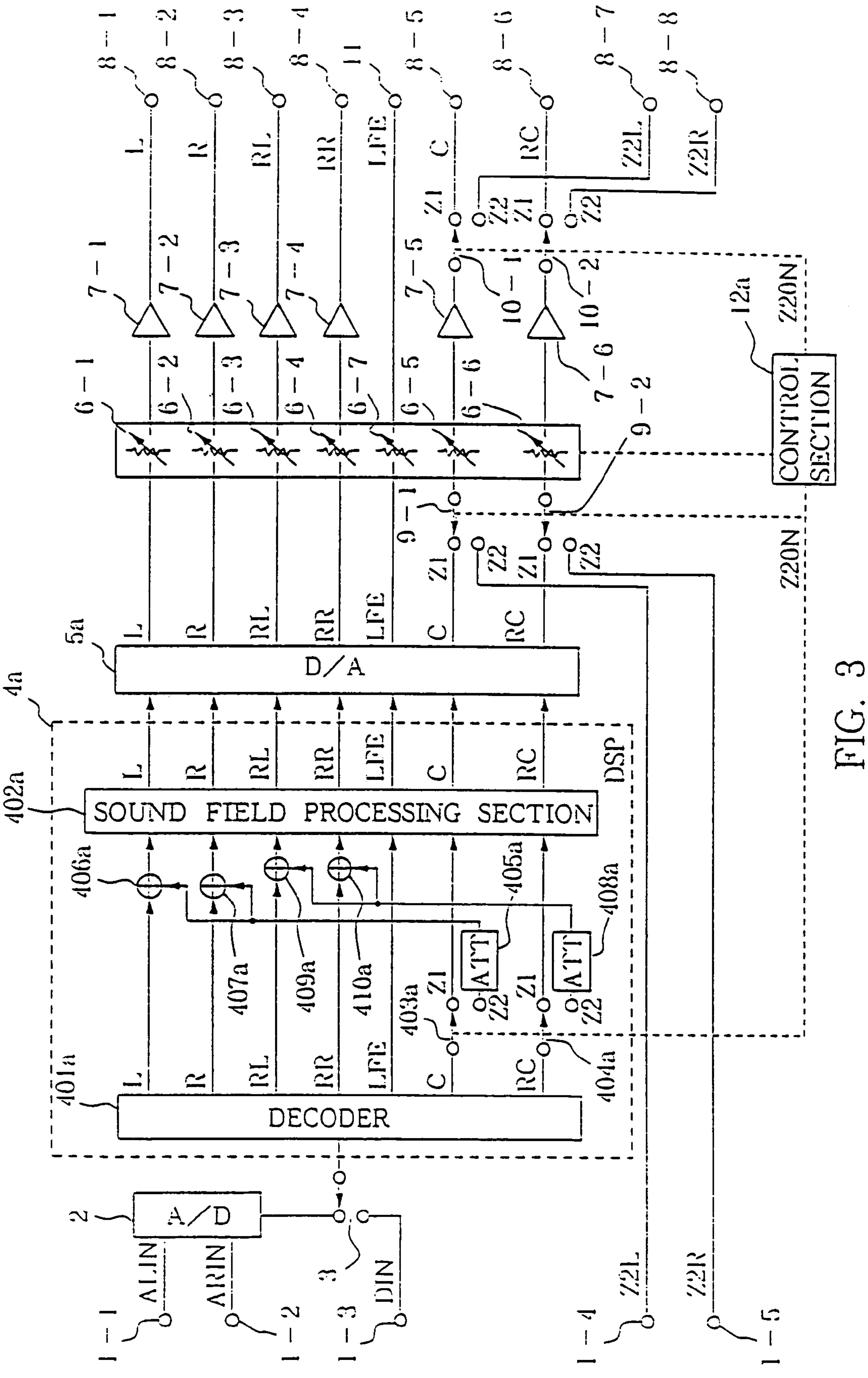
FIG. 3 is a block diagram showing a setup of an audio reproduction apparatus in accordance with a second embodiment of the present invention.

FIG. 3 is a block diagram showing a setup of an audio reproduction apparatus in accordance with a second embodiment of the present invention, where the same elements as in the embodiment of FIG. 1 are represented by the same reference characters as in FIG. 1. Whereas the first embodiment has been described as including the sound-volume adjusting volume controls 6-8 and 6-9 for the second zone Zone 2 separately from the sound-volume adjusting volume controls 6-1 to 6—6 for the first zone Zone 1, the second embodiment is characterized in that the volume controls 6-5 and 6—6 are shared between the first zone Zone 1 (signals C and RC) and the second zone Zone 2 (signals Z2L and Z2R). Control section 12*a* has, in addition to the functions of the control section 12 in the first embodiment, a function of setting values of the volume controls 6-5 and 6—6 when the Zone-2 audio reproduction switch is turned on or off.

Figure 4:
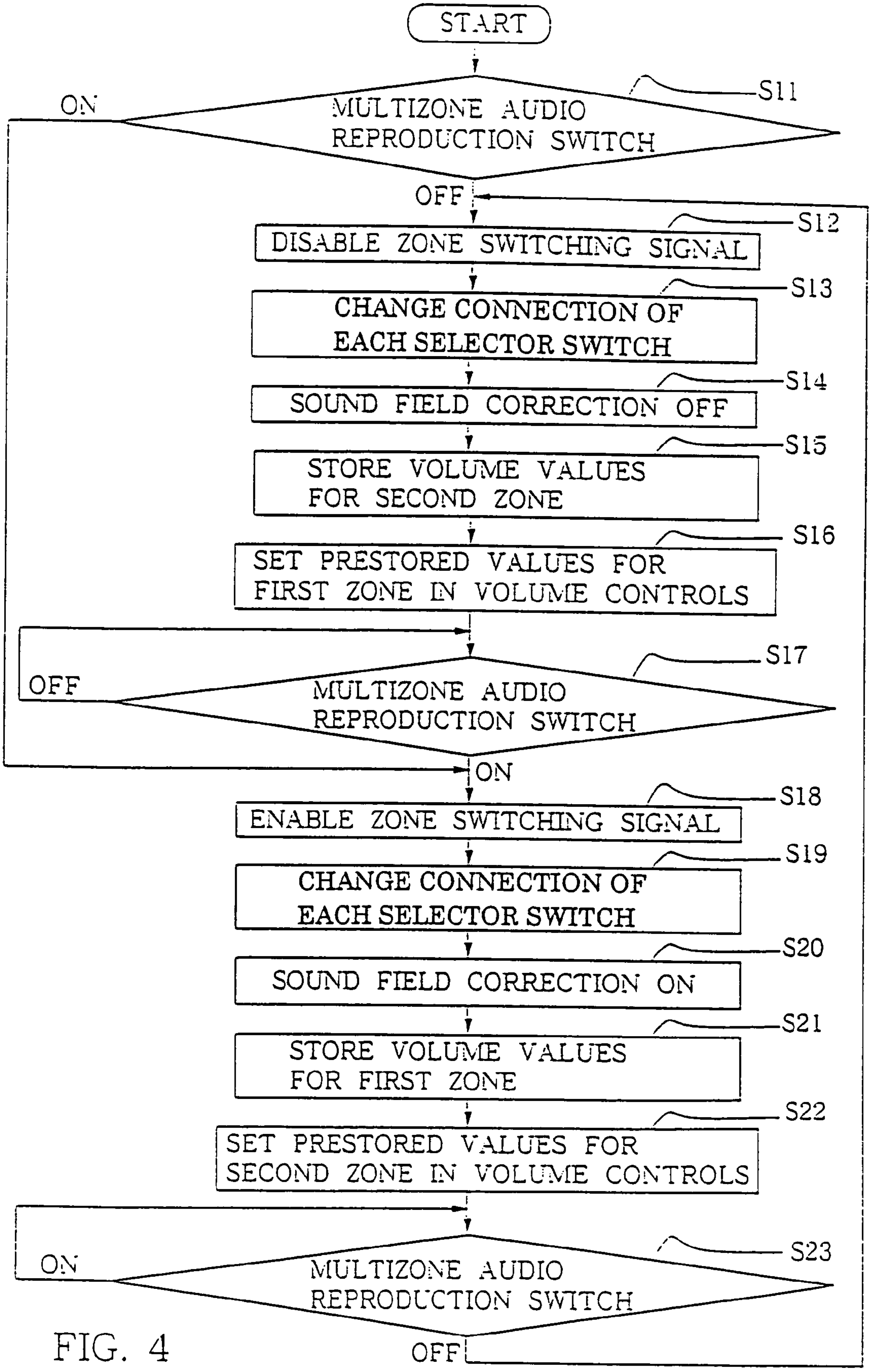
FIG. 4 is a flow chart showing operations performed by the second embodiment of the audio reproduction apparatus of FIG. 3 as the Zone-2 audio reproduction function is turned on and off.

FIG. 4 is a flow chart showing operations performed by the audio reproduction apparatus of FIG. 3 as the Zone-2 audio reproduction function is turned on and off. The operations of step S12, S13 and S14 performed when the Zone-2 audio reproduction switch of the audio reproduction apparatus is turned off (determined as "OFF" at step S11) are similar to those of steps S2, S3 and S4 of FIG. 2.

Once the Zone-2 audio reproduction switch is shifted from the ON state to the OFF state, the control section 12*a* invalidates or disables the zone switching signal Z2ON at step S12, and it also stores, as volume values V2-5 and V2-6 for the second zone Zone 2, values of the volume controls 6-5 and 6—6 immediately before the turning-off of the Zone-2 audio reproduction switch, at step S15. In addition, at step S16, prestored volume values V1-5 and V1-6 for the first zone Zone 1 are set in the volume controls 6-5 and 6—6, respectively. Note that all of the volume controls are preset at predetermined values prior to shipment from the factory. After use by a user, tt is also possible to hold a volume value set by the user in the control section 12*a*.

The operations of step S18, S19 and S20 performed when the Zone-2 audio reproduction switch of the audio reproduction apparatus is turned on are similar to those of steps S6, S7 and S8 of FIG. 2. Namely, the control section 12*a* enables the zone switching signal Z2ON at step S18, and at step S21, it also stores, as volume values V1-5 and V1-6 for the first zone Zone 1, values of the volume controls 6-5 and 6—6 immediately before the turning-on of the zone switching signal Z2ON. In addition, at step S22, prestored volume values V2-5 and V2-6 for the second zone Zone 2 are set in the volume controls 6-5 and 6—6, respectively.

That is, in the second embodiment, the volume controls 6-5 and 6—6 are shared between the first zone Zone 1 and the second zone Zone 2 so that the volume controls 6-8 and 6-9 for the second zone Zone 2 can be dispensed with. As a consequence, the second embodiment can significantly reduce the number of the necessary components as compared with the first embodiment.

Further, according to the second embodiment, the volume values V1-5 and V1-6 for the first zone Zone 1 are set in the volume controls 6-5 and 6—6 when the Zone-2 audio reproduction function is not to be used and the volume values V2-5 and V2-6 for the second zone Zone 2 are set in the volume controls 6-5 and 6—6 when the Zone-2 audio reproduction function is to be used. With such arrangements, the second embodiment can eliminate a need for the user to re-set the volume controls 6-5 and 6—6 in accordance with the ON/OFF state of the Zone-2 audio reproduction function, thereby enhancing convenience for the user (user friendliness).

Note that, during the course of switching operations of the selector switches 9-1, 9-2, 10-1 and 10-2 and the switches 403*a* and 404*a* within the DSP 4*a* for setting values in the volume controls 6—6 and 6—6 at steps S12 to S16 and S18 to S22 of FIG. 4, the instant embodiment performs operations, for example, for turning off all outputs of the sound processing section 402*a*, so as to prevent undesired sounds from being produced inadvertently due to switching time differences etc.

[Third Embodiment]

Figure 5:
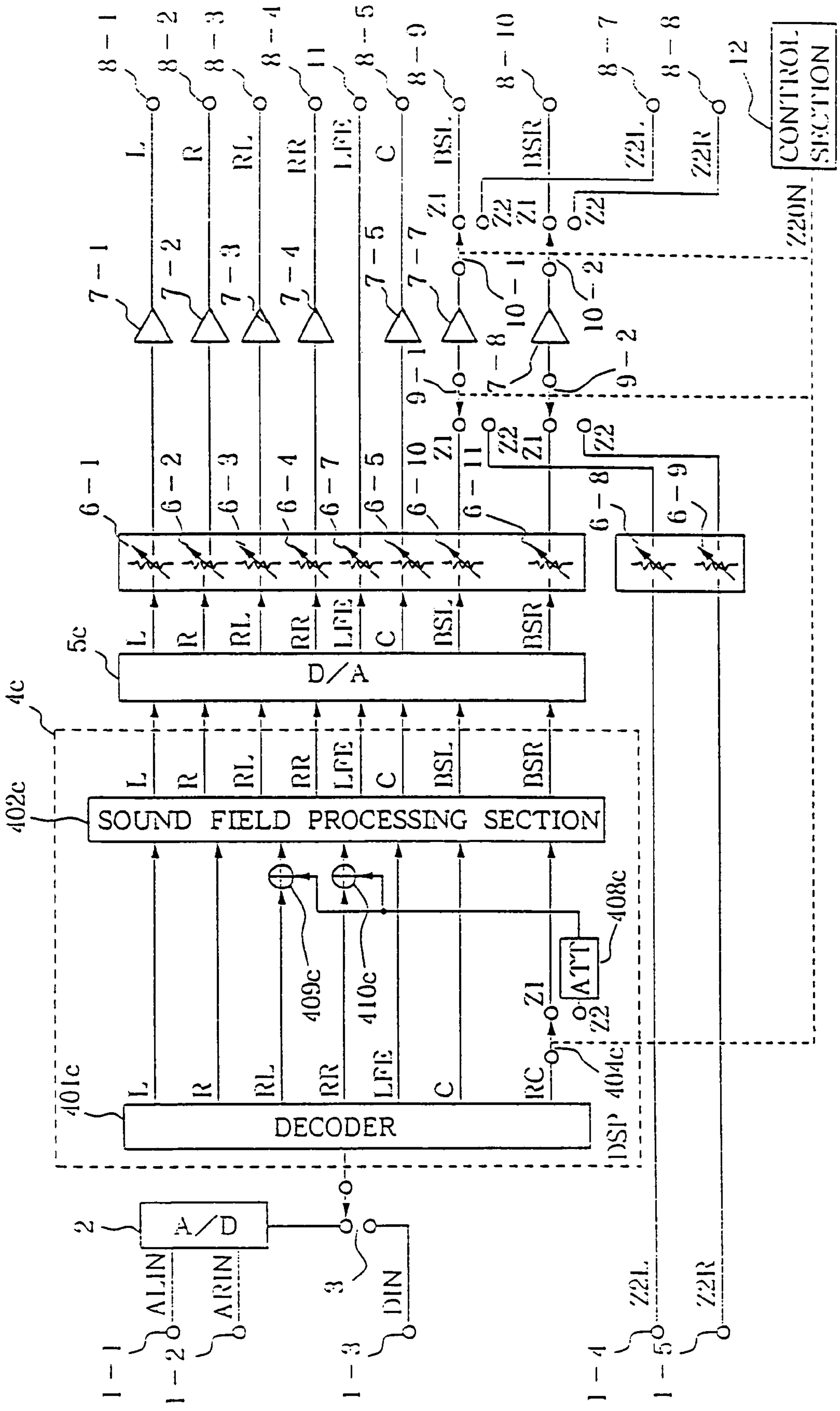
FIG. 5 is a block diagram showing a setup of an audio reproduction apparatus in accordance with a third embodiment of the present invention.

FIG. 5 is a block diagram showing a setup of an audio reproduction apparatus in accordance with a third embodiment of the present invention, where the same elements as in the embodiment of FIG. 1 are represented by the same reference characters as in FIG. 1. The third embodiment is characterized by applying the basic principles of the present invention to an audio reproduction apparatus provided with built-in power amplifiers for n (=7) channels. Specifically, in the third embodiment, the selector switches 9-1 and 9-2 are provided between the volume controls 6-10 and 6-11 and the power amplifiers 7—7 and 7-8, and the selector switches 10-1 and 10-2 are provided between the power amplifiers 7—7 and 7-8 and the speaker terminals 8-9 and 8-10.

Decoder 401*c* of a DSP 4*c* generates, on the basis of a digital audio signal output from the selector 3, various audio signals, i.e. main left and right signals L and R, rear left and right signals RL and RR, center signal C, rear center signal RC and subwoofer signal LFE, and it sends the thus-generated audio signals to a sound field processing section 402*c*.

The sound field processing section 402*c* outputs each of the main left and right signals L and R, rear left and right signals RL and RR, center signal C, subwoofer signal LFE and rear surround signals BSL and BSR (first audio signals) to a D/A converter 5*c*. At that time, the sound field processing section 402*c* generates the rear surround signals BSL and BSR on the basis of the rear center signal RC.

The D/A converter 5*c* converts each of the audio signals from the DSP 4*c* into an analog signal. The main left and right signals L and R and rear left and right signals RL and RR, output from the D/A converter 5*c*, are processed in generally the same manner as in the first embodiment. The center signal C output from the D/A converter 5*c* is sent through the volume control 6-5 to the power amplifier 7-5 for amplification, and the thus-amplified center signal C is then output via the speaker terminal 8-5.

Figure 6:
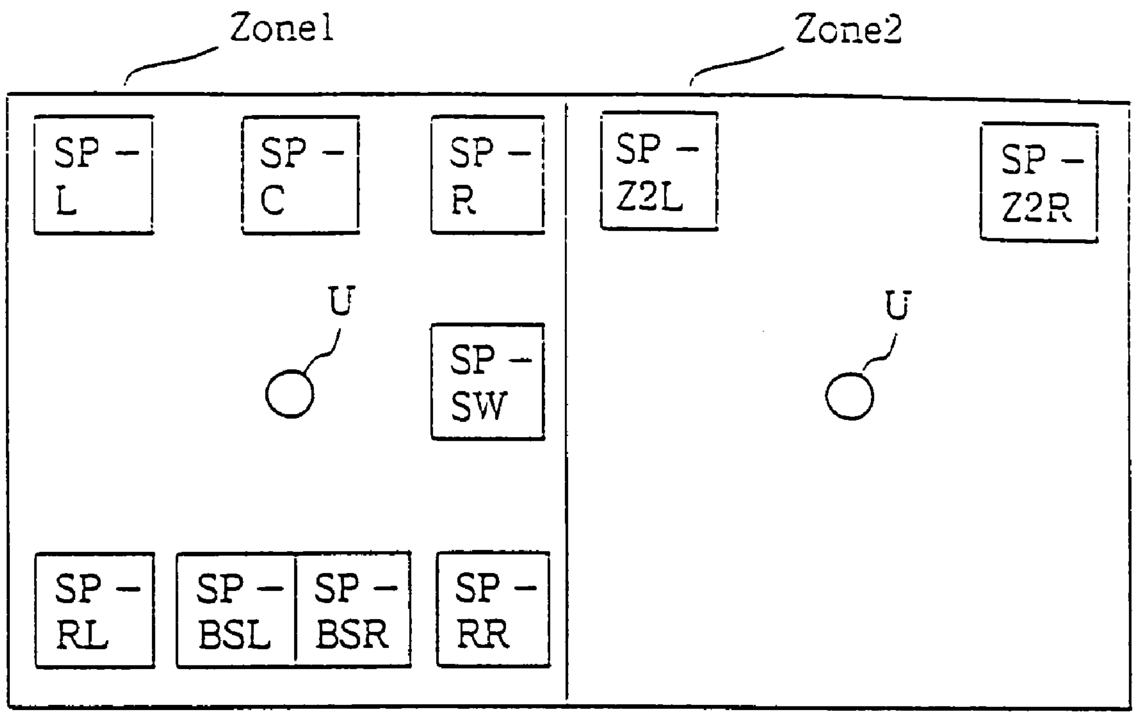
FIG. 6 is a plan view showing layout or arrangement of speakers in a first zone and speakers in a second zone employed in the third embodiment of FIG. 5.

FIG. 6 is a plan view showing arrangement of speakers in the first zone Zone 1 and in the second zone Zone 2 employed in the audio reproduction apparatus of FIG. 5. In the third embodiment, rear surround speakers SP-BSL and SP-BSR are employed in place of the rear center speaker SP-RC of the first zone Zone 1 described above in relation to FIG. 10, and the speaker terminals 8-9 and 8-10 are connected to the rear surround speakers SP-BSL and SP-BSR, respectively.

Operations performed by the audio reproduction apparatus of FIG. 5 as the Zone-2 audio reproduction function is turned on and off are similar to those performed in the first embodiment, except that the terms "center signal C" and "rear center signal RC" are replaced with "rear surround signal BSL" and "rear surround signal BSR", respectively. Thus, the operations performed by the audio reproduction apparatus of FIG. 5 as the Zone-2 audio reproduction function is turned on and off will be described with reference to FIG. 2.

Namely, if the Zone-2 audio reproduction switch is turned off as determined at step S1 of FIG. 2, the zone switching signal Z2ON is disabled at step S2, and each of the selector switches 9-1, 9-2, 10-1 and 10-2 is caused to connect to the Z1 contact at step S3. Also, a switch 404*c* within the DSP 4*c* is caused to connect to the Z1 contact, at step S4.

The rear surround signals BSL and BSR, output from the DSP 4*c*, are converted by the D/A converter 5*c* into analog signals and then sent via the corresponding volume controls 6-10 and 6-11 and selector switches 9-1 and 9-2, to the power amplifiers 7—7 and 7-8 for amplification. Then, the thus-amplified rear surround signals BSL and BSR are passed via the selector switches 10-1 and 10-2 to the speaker terminals 8-9 and 8-10 to be output therefrom. In this manner, 7.1-channel audio reproduction is performed in the first zone Zone 1.

On the other hand, if the Zone-2 audio reproduction switch is turned on as determined at step S5 of FIG. 2, the zone switching signal Z2ON is enabled at step S6, so that each of the selector switches 9-1, 9-2, 10-1 and 10-2 is caused to connect to the Z2 contact, at step S7. In this way, analog audio signals Z2L and Z2R, input to the input terminals 1-4 and 1-5, are sent via the corresponding volume controls 6-8 and 6-9 and selector switches 9-1 and 9-2, to the power amplifiers 7—7 and 7-8 for amplification, and the thus-amplified signals are then passed via the selector switches 10-1 and 10-2 to the speaker terminals 8-7 and 8—8 to be output therefrom.

Also, in response to the enabling of the zone switching signal Z2ON, the switch 404*c* within the DSP 4*c* is caused to connect to the Z2 contact. Thus, in order to compensate for reduction in the multichannel audio reproduction effect due to stoppage of supply, to the rear surround speakers SP-BSL and SP-BSR in the first zone Zone 1, of the rear surround signals BSL and BSR, sound field correction is performed on the rear left and right signals RL and RR to be supplied to the first zone Zone 1, at step S8.

As stated above, the rear surround signals BSL and BSR are generated on the basis of the rear center signal RC. Thus, by allocating the rear center signal RC, generated by the decoder 401*c*, to the rear left and right signals RL and RR, it is possible to execute 7.1-channel multichannel audio reproduction using the main speakers SP-L and SP-R, center speaker SP-C, rear speakers SP-RL and SP-RR and subwoofer SP-SW.

When the sound field correction is to be executed at step S8, the rear center signal RC output from the decoder 401*c* is passed via the switch 404*c* to an attenuator 408*c* for adjustment to an appropriate level, and then the level-adjusted rear center signal is added to the rear left and right signals RL and RR via adders 409*c* and 410*c*.

The rear left and right signals RL and RR, main left and right signals L and R, center signal C and subwoofer signal LFE, having been subjected to the sound field correction, are sent via the sound processing section 402*c* to the D/A converter 5*c* for conversion into analog signals, and the thus-converted rear left and right signals RL and RR, main left and right signals L and R and subwoofer signal LFE, output from the D/A converter 5*c*, are processed in generally the same manner as in the first embodiment. The converted center signal C from the D/A converter 5*c* is passed via the corresponding volume control 6-5 to the power amplifier 7-5 for amplification, and then the thus-amplified center signal C is output through the speaker output terminal 8-5.

Note that respective gains of the rear left and right signals RL and RR and rear center signal RC are set for the sound field correction such that the sound fields in the first zone Zone 1 have desired characteristics.

With the above-described arrangements, the third embodiment provided with 7-channel built-in power amplifiers can achieve the same benefits as the first embodiment. In the third embodiment of FIG. 5, the volume controls 6-10 and 6-11 can be shared between the first zone Zone 1 and the second zone Zone 2, by providing the selector switches 9-1 and 9-2 between the D/A converter 5*c* and the volume controls 6-10 and 6-11 and controlling the values of the volume controls 6-10 and 6-11 via the control section 12*a*, in response to turning on/off of the Zone-2 audio reproduction switch, in generally the same manner as in the above-described second embodiment. As a consequence, the third embodiment can achieve the same benefits as the second embodiment.

[Fourth Embodiment]

Figure 7:
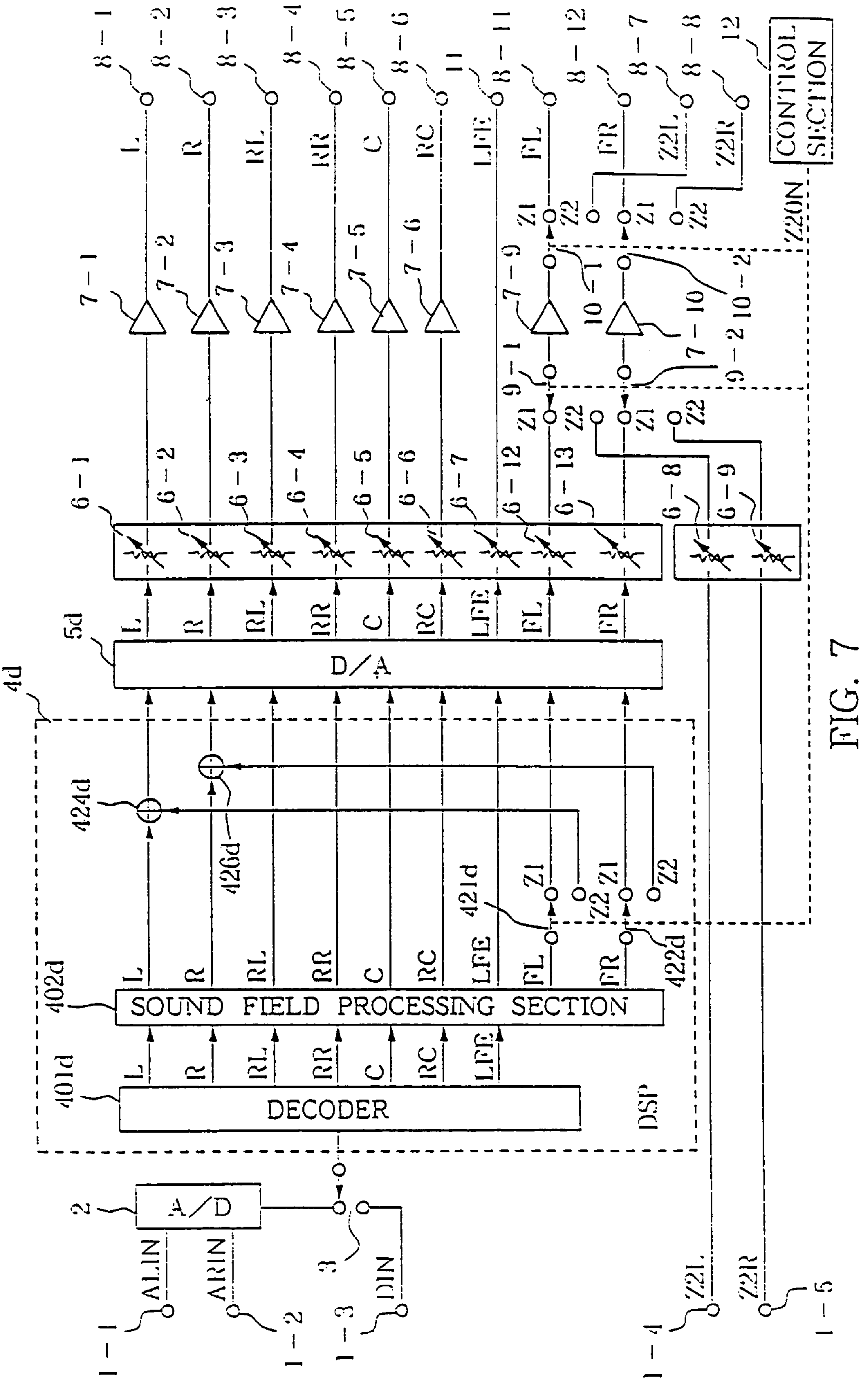
FIG. 7 is a block diagram showing a setup of an audio reproduction apparatus in accordance with a fourth embodiment of the present invention.

FIG. 7 is a block diagram showing a setup of an audio reproduction apparatus in accordance with a fourth embodiment of the present invention, where the same elements as in the embodiment of FIG. 1 are represented by the same reference characters as in FIG. 1. The fourth embodiment of FIG. 7 is characterized by applying the basic principles of the present invention to an audio reproduction apparatus provided with built-in power amplifiers for n (=8) channels. Specifically, in the fourth embodiment, the selector switches 9-1 and 9-2 are provided between the volume controls 6-12 and 6-13 and the power amplifiers 7-9 and 7-10, and the selector switches 10-1 and 10-2 are provided between the power amplifiers 7-9 and 7-10 and the speaker terminals 8-11 and 8-12.

Decoder 401*d* of a DSP 4*d* generates, on the basis of a digital audio signal output from the selector 3, various audio signals, i.e. main left and right signals L and R, rear left and right signals RL and RR, center signal C, rear center signal RC and subwoofer signal LFE, and it sends the thus-generated audio signals to a sound field processing section 402*d*.

The sound field processing section 402*d* outputs each of the main left and right signals L and R, rear left and right signals RL and RR, center signal C, rear center signal RC. and front left and right signals FL and FR to a D/A converter 5*d*. At that time, the sound field processing section 402*d* generates the front left and right signals FL and FR on the basis of the main left and right signals L and R, rear left and right signals RL and RR, center signal C and rear center signal RC.

The D/A converter 5*d* converts each of the audio signals from the DSP 4*d* into an analog signal. The main left and right signals L and R and rear left and right signals RL and RR, output from the D/A converter 5*d*, are processed in generally the same manner as in the first embodiment. The center signal C and rear center signal RC, output from the D/A converter 5*d*, are sent through the volume controls 6-5 and 6—6 to the power amplifiers 7-5 and 7-6 for amplification, and the thus-amplified center signals C and RC are then output via the speaker terminals 8-5 and 8-6.

Figure 8:
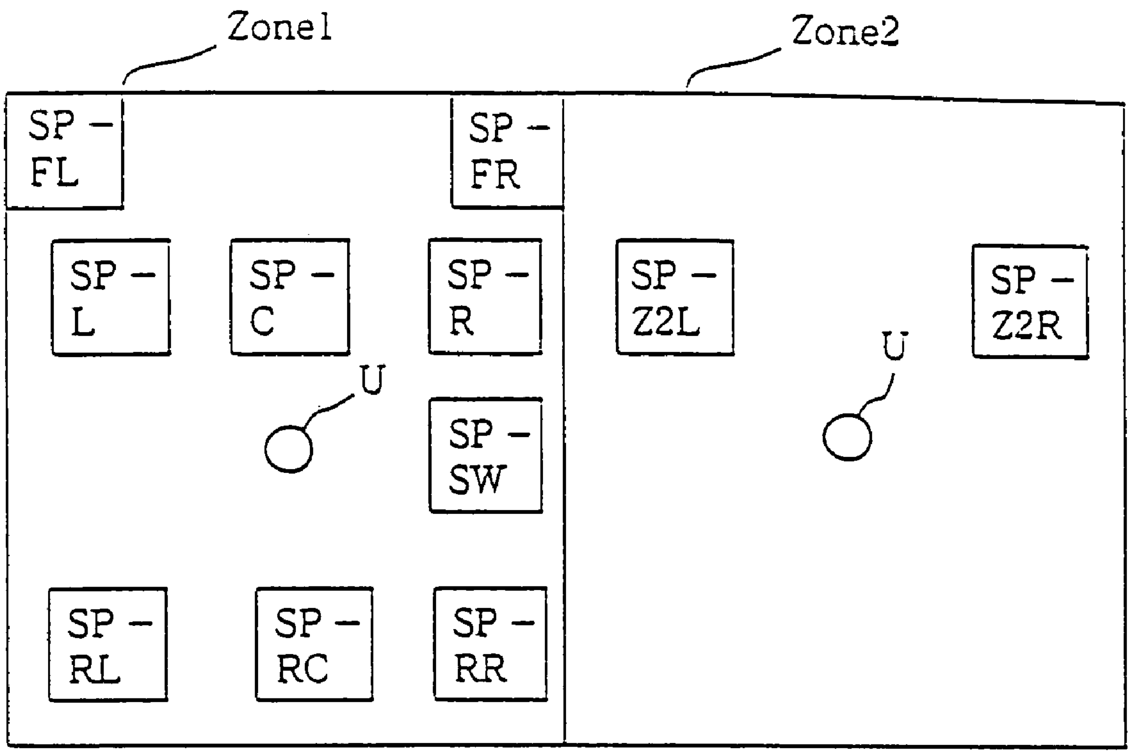
FIG. 8 is a plan view showing arrangement of speakers in a first zone and speakers in a second zone employed in the fourth embodiment of FIG. 7.

FIG. 8 is a plan view showing arrangement of speakers in the first zone Zone 1 and in the second zone Zone 2 employed in the audio reproduction apparatus of FIG. 7. In the fourth embodiment, front speakers SP-FL and SP-FR are added to the speakers of the first zone described above in relation to FIG. 10. The speaker terminals 8-11 and 8-12 are connected to the front speakers SP-FL and SP-FR, respectively.

Operations performed by the audio reproduction apparatus of FIG. 7 as the Zone-2 audio reproduction function is turned on and off are similar to those performed in the first embodiment, except that the terms "center signal C" and "rear center signal RC" are replaced with "front signal FL" and "front signal FR", respectively. Thus, the operations performed by the audio reproduction apparatus of FIG. 7 as the Zone-2 audio reproduction function is turned on and off will be described with reference to FIG. 2.

Namely, if the Zone-2 audio reproduction switch is turned off as determined at step S1 of FIG. 2, the zone switching signal Z2ON is disabled at step S2, and each of the selector switches 9-1, 9-2, 10-1 and 10-2 is caused to connect to the Z1 contact at step S3. Also, switches 421*d* and 422*d* within the DSP 4*d* are each caused to connect to the Z1 contact, at step S4.

Thus, the front left and right signals FL and FR, output from the DSP 4*d*, are converted by the D/A converter 5*d* into analog signals and then sent via the corresponding volume controls 6-12 and 6-13 and selector switches 9-1 and 9-2, to the power amplifiers 7-9 and 7-10 for amplification. Then, the thus-amplified front left and right signals FL and FR are passed via the selector switches 10-1 and 10-2 to the speaker terminals 8-11 and 8-12 to be output therefrom. In this manner, 8.1-channel audio reproduction is performed in the first zone Zone 1.

On the other hand, if the Zone-2 audio reproduction switch is turned on as determined at step S5 of FIG. 2, the zone enabling signal Z2ON is enabled at step S6, so that each of the selector switches 9-1, 9-2, 10-1 and 10-2 is caused to connect to the Z2 contact, at step S7. In this way, analog audio signals Z2L and Z2R, input to the input terminals 1-4 and 1-5, are sent, via the corresponding volume controls 6-8 and 6-9 and selector switches 9-1 and 9-2, to the power amplifiers 7-9 and 7-10 for amplification, and the thus-amplified signals are then passed via the selector switches 10-1 and 10-2 to the speaker terminals 8-7 and 8—8 to be output therefrom.

Also, in response to the enabling of the zone switching signal Z2ON, the switches 421*d* and 422*d* within the DSP 4*d* are each caused to connect to the Z2 contact. Thus, in order to compensate for reduction in the multichannel audio reproduction effect due to stoppage of supply, to the front speakers SP-FL and SP-FR of the first zone Zone 1, of the front left and right signals FL and FR, sound field correction is performed on the main left and right signals L and R to be supplied to the first zone Zone 1, at step S8.

In the fourth embodiment, the front left and right signals FL and FR are added to the main left and right signals L and R, respectively, in order to execute 8.1-channel multichannel audio reproduction using the main speakers SP-L and SP-R, rear speakers SP-RL and SP-RR, center speaker SP-C, rear center speaker SP-RC and subwoofer SP-SW.

Namely, the front left signal FL output from the sound processing section 402*d* is passed via the switch 421*d* to an adder 424*d* for addition to the main left signal L, while the front right signal FR output from the sound processing section 402*d* is passed via the switch 422*d* to an adder 426*d* for addition to the main right signal R.

The main left and right signals L and R, rear left and right signals RL and RR, center signal C, rear center signal RC and subwoofer signal LFE, having been subjected to the sound field correction in the above-described manner, are sent to the D/A converter 5*d*. The main left and right signals L and R, rear left and right signals RL and RR and subwoofer signal LFE, output from the D/A converter 5*d*, are processed in generally the same manner as in the first embodiment. The center signal C and rear center signal RC, output from the D/A converter 5*d*, are sent through the volume controls 6-5 and 6—6 to the power amplifiers 7-5 and 7-6 for amplification, and the thus-amplified center signal C and rear center signal RC are then output via the speaker terminals 8-5 and 8-6.

Note that respective gains of the main left and right signals L and R and front left and right signals FL and FR are set for the sound field correction such that the sound fields in the first zone Zone 1 have desired characteristics.

With the above-described arrangements, the fourth embodiment provided with 8-channel built-in power amplifiers can achieve the same benefits as the first embodiment. In the fourth embodiment of FIG. 7, the volume controls 6-12 and 6-13 can be shared between the first zone Zone 1 and the second zone Zone 2, by providing the selector switches 9-1 and 9-2 between the D/A converter 5*d* and the volume controls 6-12 and 6-13 and controlling the values of the volume controls 6-12 and 6-13 via the control section 12*a*, in response to turning on/off of the Zone-2 audio reproduction switch, in generally the same manner as in the second embodiment. As a consequence, the fourth embodiment can achieve the same benefits as the second embodiment.

Whereas, in the above-described first to fourth embodiments, analog audio signals Z2L and Z2R are input to the audio reproduction apparatus as signals to be delivered to the second zone Zone 2, the present invention is not so limited. For example, digital audio signals Z2L and Z2R may be input to the audio reproduction apparatus and converted into analog audio signals so as to be delivered to the second zone Zone 2.

The sound field correction of the first zone Zone 1 in each of the first to fourth embodiments may be carried out in any desired manner other than the above-described. Further, because separate power amplifiers are allocated to the second zone Zone 2, if rear surround components can not be output from the rear speakers of the first zone Zone 1, the sound field correction may be carried out by so-called virtual sound field processing such that the rear sound fields can be reproduced by the front speakers alone.

The present invention having been described above in relation to the first to fourth embodiments can be summarized as follows. Namely, according to the present invention, when the audio reproduction apparatus is in the first mode where no audio reproduction is to be executed in the second zone, a first audio signal of m channel is selected via the first selector switch and supplied to the power amplifier of the m channel, and the output of the power amplifier of the m channel is coupled, via the second selector switch, to a speaker terminal of the first zone. In this way, the maximum multichannel audio reproduction effect can be achieved in the first zone. Further, in the second mode, the DSP carries out sound field correction such that the sound fields in the first zone have desired characteristics, so that the present invention can appropriately compensate for reduction in the multichannel audio reproduction effect due to stoppage of supply, to the first zone, of the first audio signal of the m channel and thereby achieves a sufficient multichannel audio reproduction effect.

Further, in the present invention, a particular volume control is shared between sound volume adjustment of the first audio signal of the m channel and sound volume adjustment of the second audio signal of the m channel, and thus the number of the necessary components can be reduced significantly.

Furthermore, as a switchover takes place from the first mode to the second mode, a current value of the volume control of the m channel, having been adjusting the sound volume of the first audio signal, is stored as a volume value for the first zone, and a prestored volume value for the second zone is set in the volume control of the m channel. On the other hand, as a switchover takes place from the second mode to the first mode, a current value of the volume control of the m channel, having been adjusting the sound volume of the second audio signal, is stored as a volume value for the second zone, and a prestored volume value for the first zone is set in the volume control of the m channel. Such arrangements can eliminate the need for the user to re-set the volume control in response to switching of the mode and thereby enhance the convenience for the user (user friendliness).

[Fifth Embodiment]

In the embodiments of FIGS. 1 to 4, description has been made with respect to a case where only one second zone is provided. The second zone may be provided in plurality.

Figure 9:
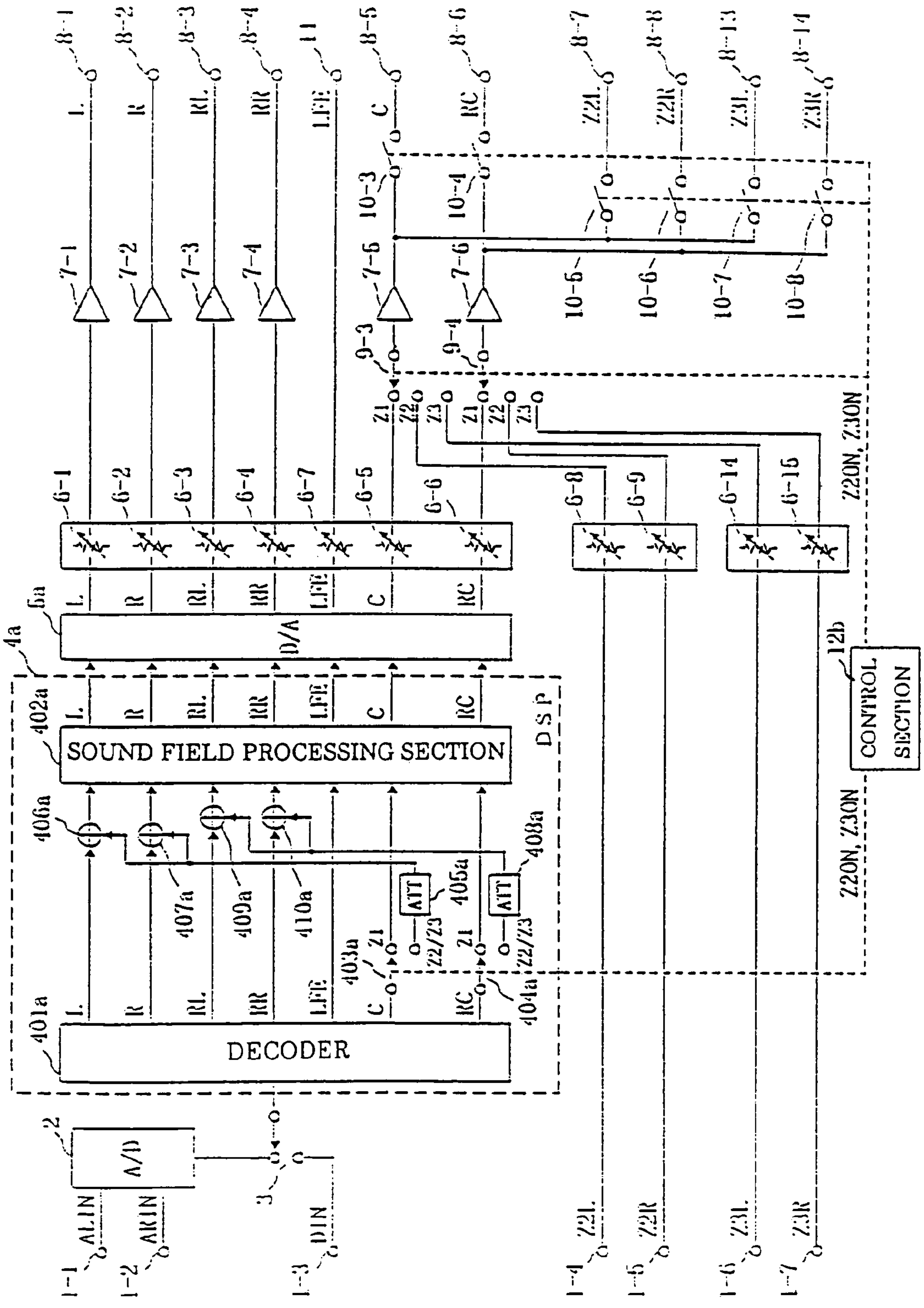
FIG. 9 is a block diagram showing a setup of an audio reproduction apparatus in accordance with a fifth embodiment of the present invention.

FIG. 9 is a block diagram showing a setup of an audio reproduction apparatus in accordance with a fifth embodiment of the present invention, where the same elements as in the embodiment of FIG. 1 are represented by the same reference characters as in FIG. 1. The fifth embodiment of FIG. 9 is characterized by applying the basic principles of the present invention to an audio reproduction apparatus provided with built-in power amplifiers for n (=6) channels. Specifically, in the fifth embodiment, the first selector switches 9-3 and 9-4 are provided between the volume controls 6-5 and 6—6 and the power amplifiers 7-5 and 7-6, and the second selector switches 10-3, 10-4, 10-5, 10-6, 10-7 and 10-8 are provided between the power amplifiers 7-5 and 7-6 and the speaker terminals 8-5, 8-6, 8-7, 8—8, 8-13 and 8-14.

Decoder 401*a* of a DSP 4*a* generates, on the basis of a digital audio signal output from the selector 3, various audio signals, i.e. main left and right signals L and R, rear left and right signals RL and RR, center signal C, rear center signal RC and subwoofer signal LFE.

These audio signals are outputted through a sound processing section 402*a* to a D/A converter 5*a* where they are converted to analog signals. The main left and right signals L and R, rear left and right signals RL and RR and subwoofer signal LFE output by the D/A converter 5*a* are processed in the same manner as in the embodiment of FIG. 1.

Figure 10:
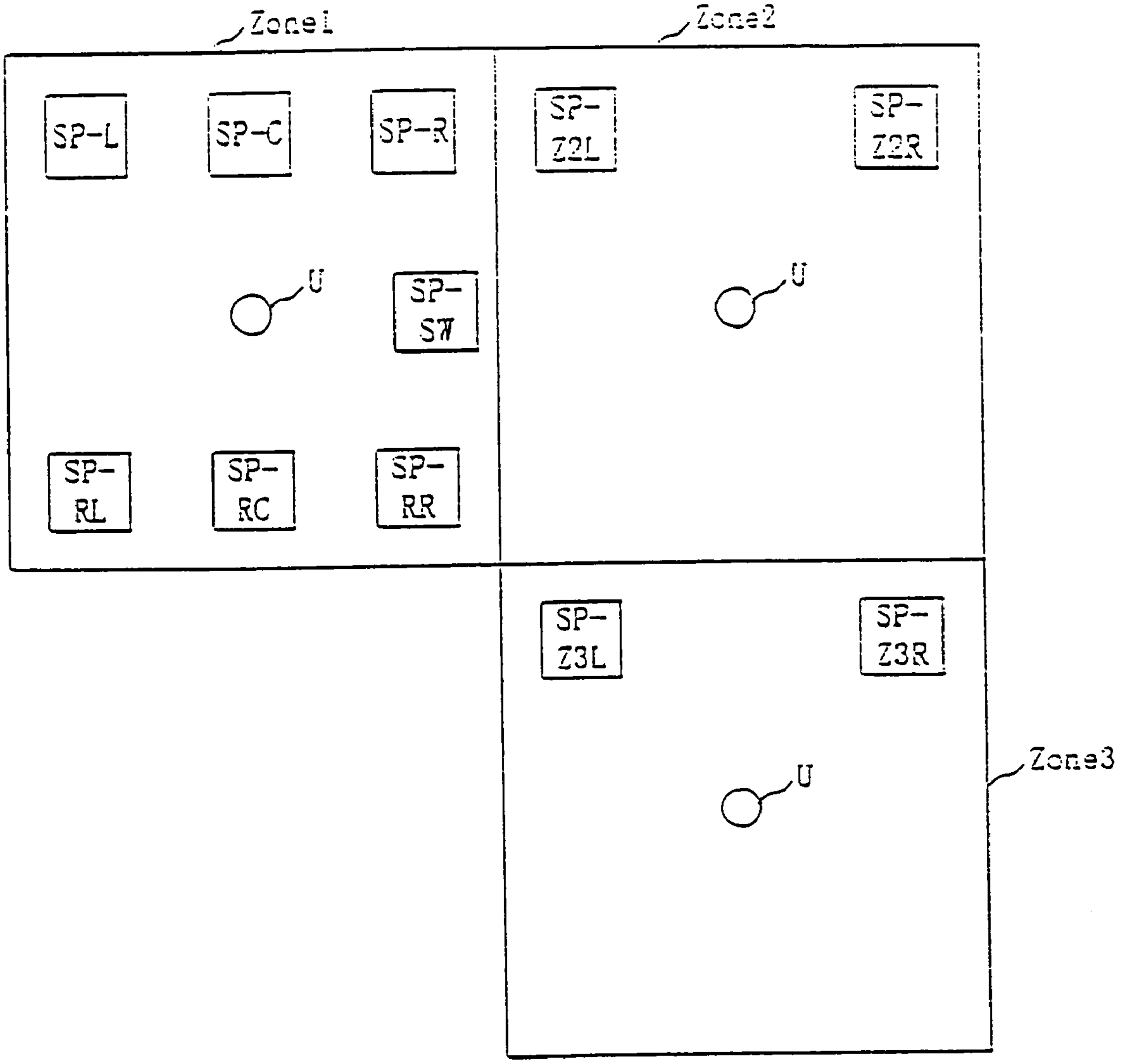
FIG. 10 is a plan view showing arrangement of speakers in a first zone and speakers in a second zone employed in the fifth embodiment of FIG. 9.

FIG. 10 is a plan view showing arrangement of speakers in the first zone Zone 1 and in the second zones Zone 2 and Zone3 employed in the audio reproduction apparatus of FIG. 9. In the fifth embodiment, speakers SP-Z3L and SP-Z3R are provided in the second zone Zone3. Speaker terminals 8-13 and 8-14 are connected to the speaker SP-Z3L and SP-Z3R respectively.

In this embodiment, since there are two second zones, a Zone 2 audio reproduction signal (not shown) for selecting the Zone 2 and a Zone3 audio reproduction switch (not shown) for selecting the Zone3 are provided in the audio reproduction apparatus of FIG. 9. When the user does not perform audio reproduction in the second zones Zone 2 and Zone3, the Zone 2 audio reproduction switch and the Zone3 audio reproduction switch are turned off. When the Zone 2. audio reproduction switch and the Zone3 audio reproduction switch are both off, a control section 12*b* disables the zone switching signals Z2ON and Z3ON as steps S1 and S2 of FIG. 2. When the zone switching signals Z2ON and Z3ON are disabled, the selector switches 9-3 and 9-4 are caused to connect to the Z1 contact whereby the selector switches 10-5, 10-6, 10-7 and 10-8 are turned off and the selector switches 10-3 and 10-4 are tuned on as step S3. When the zone switching signals Z2ON and Z3ON are disabled, switches 403*a* and 404*a* in the DSP 4*a* are caused to connect to the Z1 contact as step S4.

The center signal C and rear center signal RC output from the D/A converter 5*a* are sent, via the volume controls 6-5 and 6—6 and the selector switches 9-3 and 9-4, to the power amplifiers 7-5 and 7-6 for amplification and the amplified signals are then output from the speaker terminals 8-5 and 8-6 via the selector switches 10-3 and 10-4. In this manner, 6.1 channel audio reproduction is performed in the first zone Zone 1.

Then, when the user performs audio reproduction in the second zone Zone 2, he turns on the Zone 2 audio reproduction switch. When the Zone 2 audio reproduction switch is turned on, the control section 12*b* enables the zone switching signal Z2ON as steps S5 and S6. When the zone switching signal Z2ON is enabled, the selector switches 9-3 and 9-4 are caused to connect to the Z2 contact whereby the selector switches 10-3, 10-4, 10-7and 10-8 are turned off and the selector switches 10-5 and 10-6 are turned on as steps S7.

Analog audio signals (second audio signals) Z2L and Z2R applied to input terminals 1-4 and 1-5 thereby are sent, via the volume controls 6-8 and 6-9 and the selector switches 9-3 and 9-4, to the power amplifier 7-5 and 7-6 for amplification. The amplified signals are sent through the selector switches 10-5 and 10-6 and to the speaker terminals 8-7 and 8—8 to be output therefrom. Since the speaker terminals 8-7 and 8—8 are connected to the speakers SP-Z2L and SP-Z2R of trhe second zone Zone 2, audio reproduction of two channels is performed in the second zone Zone 2.

On the other hand, the switches 403*a* and 404*a* in the DSP 4*a* are caused to connect to the Z2/Z3 contact when the zone switching signal Z2ON is enabled. Sound field correction is thereby performed on the main left and right signals L and R and the rear left and right signals RL and RR supplied to the first zone Zone 1 as step S8. The sound field correction at this time is the same as the sound field correction in the first embodiment and, therefore, detailed description thereof will be omitted.

Then, when the user performs audio reproduction in the second zone Zone3, he turns on the Zone3 audio reproduction switch. When the Zone3 audio reproduction switch is turned on, the control section 12*b* enables the zone switching signal Z3ON as steps S5 and S6. When the zone switching signal Z3ON is enabled, the selector switches 9-3 and 9-4 are caused to connect to the Z3 contact, the selector switches 10-3, 1-4, 10-5 and 10-6 are turned off and the selector switches 10-7 and 10-8 are turned on as step S7.

The analog audo signals (second audio signals) Z3L and Z3R applied to the input terminals 1-6 and 1-7 thereby are sent, via the volume controls 6-14 and 6-15 and the selector switches 9-3 and 9-4, to the power amplifiers 7-5 and 7-6 for amplification and the amplified signals are sent through the selector switches 10-7 and. 10-8 to the speaker terminals 8-13 and 8-14 to be output therefrom. Since the speaker terminals 8-13 and 8-14 are connected to the speakers SP-Z3L and SP-Z3R of the second zone, two-channel sound field correction is performed in the second zone Zone3.

When zone switching signal Z3ON is enabled, the switches 403*a* and 404*a* in the DSP 4*a* are caused to connect to the Z2/Z3 contact in the same manner as in the case where Z2ON is enabled.

As described in the foregoing, in the preset embodiment, an audio signal can be supplied from an audio reproduction apparatus having a built-in power amplifiers of n (=6) channels to one zone in a plurality of second zones and, when audio reproduction is actually performed in the second zone Zone 2 or Zone3, reduction in the multichannel audio reproduction effect in the first zone Zone 1 can be compensated by applying sound field correction to the main left and right signals L and R and the rear left and right signals RL and RR by DSP 4*a*.

In the present embodiment, since an audio signal is supplied to only one zone among a plurality of second zones, it is necessary to predetermine priority between Zone 2 and Zone3 having regard to a case where the Zone 2 audio reproduction switch and the Zone3 audio reproduction switch are both turned on. When the Zone 2 audio reproduction switch and the Zone3 audio reproduction switch are both turned on, the control section 12*b* enables either one of the zone switching signals Z2ON and Z3ON according to the predetermined priority.

[Sixth Embodiment]

Figure 11:
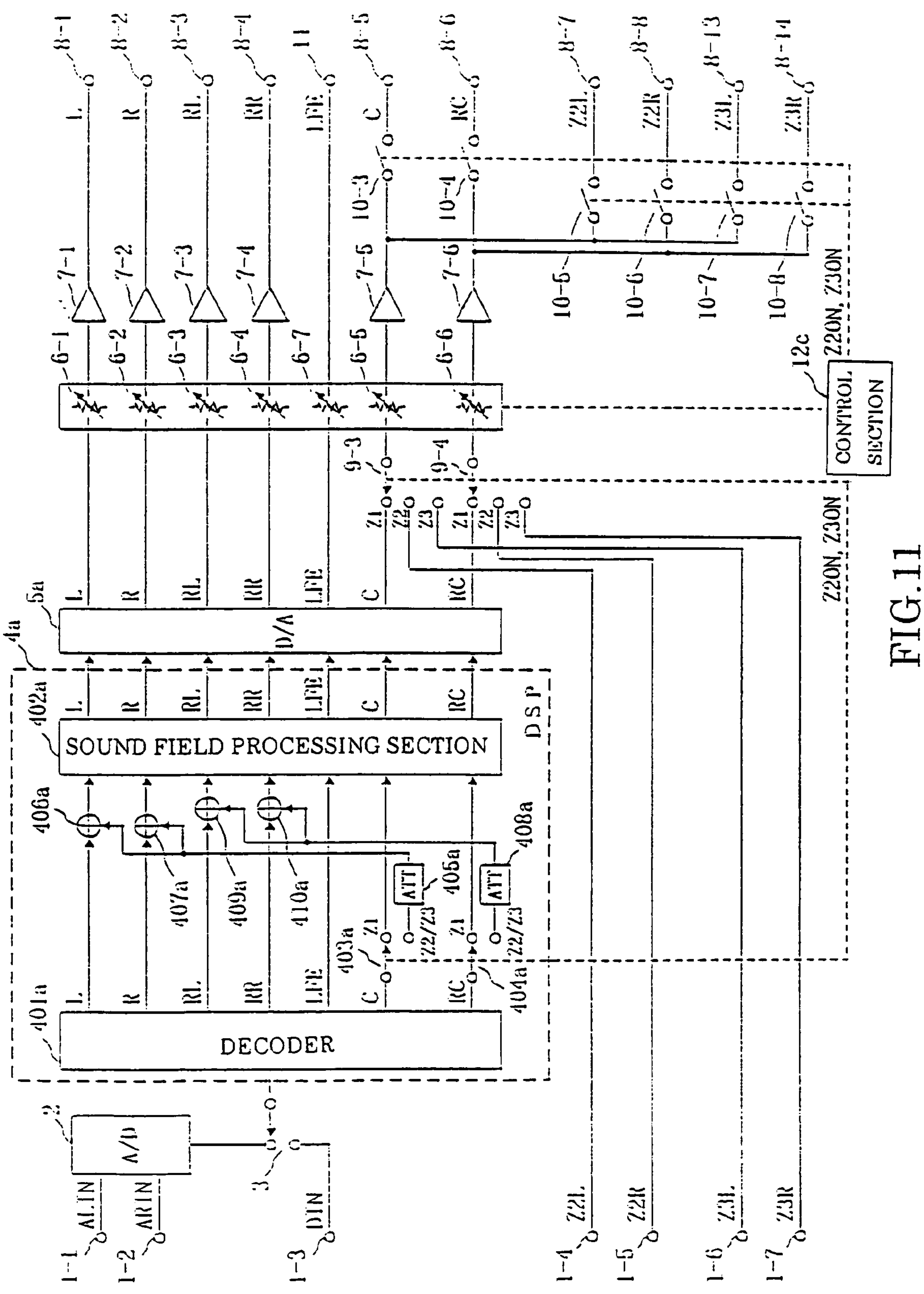
FIG. 11 is a block diagram showing a setup of an audio reproduction apparatus in accordance with a sixth embodiment of the present invention.

FIG. 11 is a block diagram showing a setup of an audio reproduction apparatus in accordance with a sixth embodiment of the present invention, where the same elements as in the embodiment of FIG. 9 are represented by the same reference characters as in FIG. 9. In the fifth embodiment, the volume controls 6-8, 6-9, 6-14 and 6-15 for the second zones Zone 2 and Zone3 are provided in addition to the volumes 6-1 to 6-7 for the first zone Zone 1. In the present embodiment, the volumes 6-5 and 6—6 are used commonly for both the first zone Zone 1 and the second zones Zone 2 and Zone 3. A control section 12*c* performs the function of setting values of the volumes 6-5 and 6—6 in addition to the function of the control section 12*b* of the fifth embodiment.

Since the processimg of turning on and off the Zone 2 audio reproduction switch and the Zone3 audio reproduction switch is performed in the same manner as in the second embodiment, the operation of the present embodiment will be explained with reference to FIG. 4. The processing of steps S11, S12, S13 and S14 in FIG. 4 are the same as the processing of steps S1, S2, S3 and S4 of the fifth embodiment.

When the Zone 2 audio reproduction switch is turned off from the on state while the Zone3 audio reproduction switch is off, the control section 12*c* disables the zone switching signal Z2ON as step S12, stores values of the volume controls 6-5 and 6—6 available immediately before the Zone 2 audio reproduction switch is turned off as volume values V2-5 and V2-6 for the second zone Zone 2 as step S15, and sets prestored volume values V1-5 and V1-6 for the first zone Zone 1 in the volumes 6-5 and 6—6 as step 16.

When the Zone3 audio reproduction switch is turned off from the on state while the Zone 2 audio reproduction switch is off, the control section 12*c* disables the zone switching signal Z3ON as step S12, stores values of the volume controls 6-5 and 6—6 available immediately before the Zone3 audio reproduction switch is turned off as volume values V3-5 and V3-6 for the second zone Zone3 as step S15, and sets prestored volume values V1-5 and V1-6 for the first zone Zone 1 in the volumes 6-5 and 6—6 as step 16.

Steps S18, S19 and S20 carried out when the Zone 2 audio reproduction switch or Zone3 audio reproduction switch is turned on (turned on in step S17) are the same as steps S6, S7 and S8 of the fifth embodiment.

When the Zone 2 audio reproduction switch is turned on from the off state while the Zone3 audio reproduction switch is off, the control section 12*c* enables the zone switching signal Z2ON as step S18, stores values of the volume controls 6-5 and 6—6 available immediately before the Zone 2 audio reproduction switch is turned on as volume values V1-5 and V1-6 for the first zone Zone 1 as step S21, and sets prestored volume values V2-5 and V2-6 for the second zone Zone 2 in the volumes 6-5 and 6—6 as step 22.

When the Zone3 audio reproduction switch is turned on from the off state while the Zone 2 audio reproduction switch is off, the control section 12*c* enables the zone switching signal Z3ON as step S18, stores values of the volume controls 6-5 and 6—6 available immediately before the Zone3 audio reproduction switch is turned on as volume values V1-5 and V1-6 for the first zone Zone 1 as step S21, and sets prestored volume values V3-5 and V3-6 for the second zone Zone3 in the volumes 6-5 and 6—6 as step 22.

As described above, in the present embodiment, by sharing the volume controls 6-5 and 6—6 between the first zone Zone 1 and the second zones Zone 2 and Zone3, the volume controls 6-8, 6-9, 6-14 and 6-15 for the second zones Zone 2 and the Zone3 can be obviated whereby component parts can be reduced in comparison with the fifth embodiment.

Further, when the Zone 2 audio reproduction switch and the Zone3 audio reproduction switches are both off, volume values V1-5 and V1-6 for the first zone Zone 1 are set in the volume controls 6-5 and 6—6 and when the Zone 2 audio reproduction switch or Zone 3 audio reproduction switch is on, volume values V2-5 and V2-6 for the second zone Zone 2 or volumes values V3-5 and V3-6 for the second zone Zone3 are set in the volume controls 6-5 and 6—6 and, therefore, the user need not set the volume controls 6-5 and 6—6 again depending upon the on-off state of the Zone 2 audio reproduction switch and Zone 3 audio reproduction switch and this improves the user's convenience.

For preventing generation of unexpected sound due to time lag in switching during the operation for setting values of the volumes 6-5 and 6—6 by switching the selector switches 9-3, 9-4, 10-3 to 10-8 and the switches 403*a* and 404*a* in the DSP 4*a* as shown in steps S12 to S16 and S18 to S22 of FIG. 4, an appropriate processing such as turning off all output of the sound field processing section 402*a* may be performed.

[Seventh Embodiment]

In the fifth and sixth embodiments, an audio signal is supplied only to one zone among a plurality of second zones. It is also possible to supply an audio signal to plural second zones simultaneously.

Figure 12:
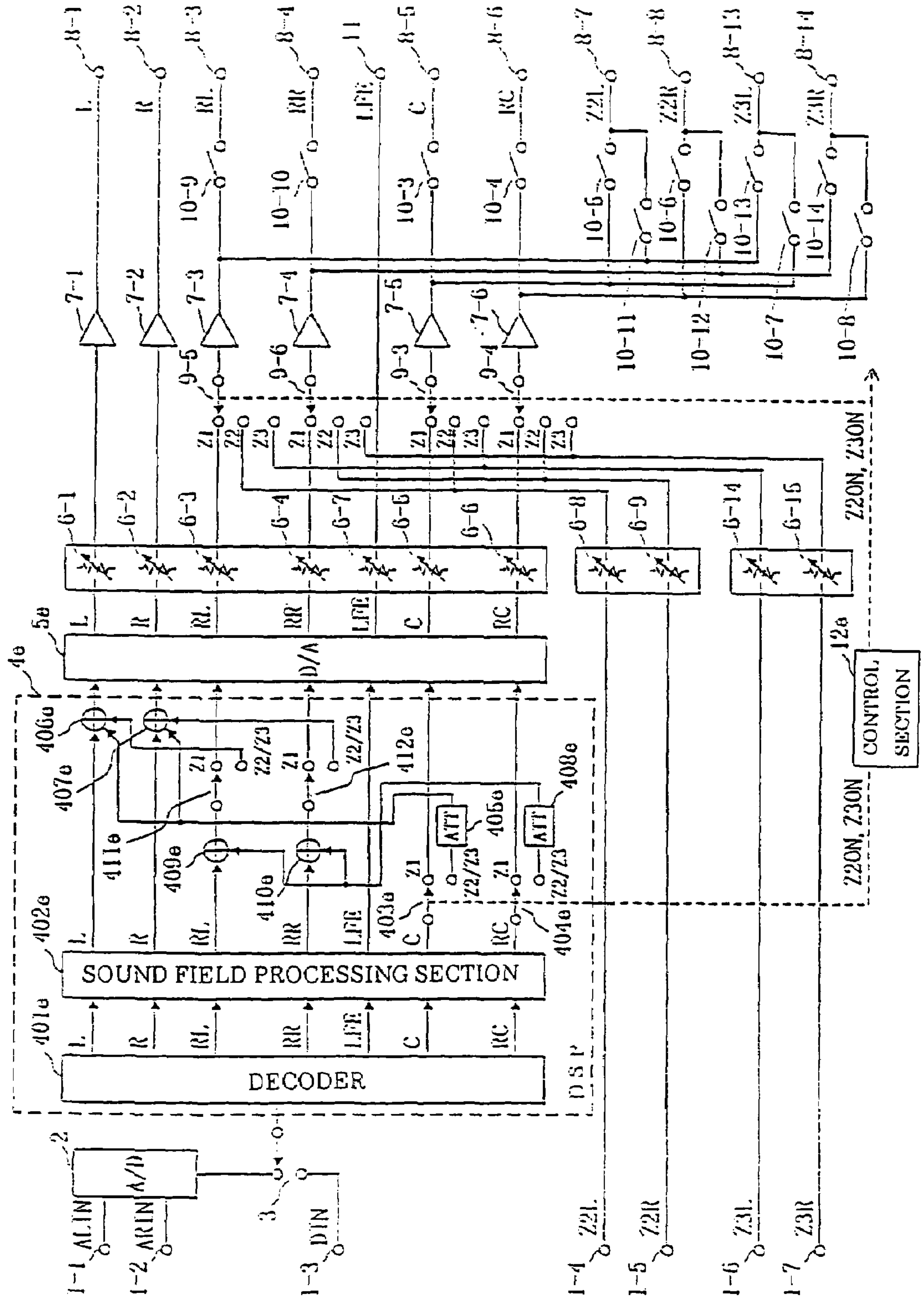
FIG. 12 is a block diagram showing a setup of an audio reproduction apparatus in accordance with a seventh embodiment of the present invention.

FIG. 12 is a block diagram showing a setup of an audio reproduction apparatus in accordance with a seventh embodiment of the present invention, where the same elements as in the embodiment of FIG. 9 are represented by the same reference characters as in FIG. 9. In this embodiment, first selector switches 9-5 and 9-6 are added between the volume controls 6-3 and 6-4 and the power amplifiers 7-3 and 7-4 of the audio reproduction apparatus of FIG. 9, seoncd selection switches 10-9 and 10—10 are added between the power amplifiers 7-3 and 7-4 and the spekaer terminals 8-3 and 8-4, second selector switches 10-11 and 10-13 are added between the power amplifiers 7-3 and 7-4 and the speaker terminals 8-7 and 8-13, and second selector switches 10-12 and 10-14 are added between the power amplifier 7-4 and the speaker terminals 8—8 and 8-14.

A decoder 401*a* of a DSP 4*e* produces audio signals (first audio signals) including main left and right signals L and R, rear left and right signals RL and Rr, center signal C, rear center signal RC and subwoofer signal LFE.

These audio signals are sent to a D/A converter 5*d* via a sound field processing section 402*e* which performs various sound field processings. These signals are converted by the D/A converter 5*e* to analog signals. Processing of the main left and right signals L and R and subwoofer signal LFE output from the D/A converter 5*e* is the same as in the first embodiment.

Speaker arrangement in the first zone Zone 1 and the second zones Zone 2 and Zone3 is shown in FIG. 10.

Since processing for turning on and off the Zone 2 audio reproduction switch and the Zone3 audio reproduction switch is performed in the same manner as in the first embodiment, the operation of the present embodiment will be described with reference to FIG. 2.

When the Zone 2 audio reproduction switch and the Zone3 audio reproduction switch are both off, the control section 12*e* disables the zone switching signals SZON and Z3ON as steps S1 and S2 in FIG. 2. When the zone switching signals Z2ON and Z3ON are disabled, the selector switches 9-3, 9-4, 9-5 and 9-6 are caused to connect to the Z1 contact, the selector switches 10-5, 10-6, 10-7, 10-8, 10-11, 10-12, 10-13 and 10-14 are turned off and the selector switches 10-3, 10-4, 10-9 and 10—10 are turned on as step S3. When the zone switching signals Z2ON and Z3ON are disabled, switches 403*e*, 404*e*, 411*e* and 412*e* in the DSP 4*e* are caused to connect to the Z1 contact as step S4.

The rear left and right signals RL and RR, center signal C and rear center signal RC output from the D/A converter 5*e* are sent, via the volume controls 6-3, 6-4, 6-5 and 6—6 and the selector switches 9-5, 9-6, 9-3 and 9-4, to the power amplifiers 7-3, 7-4, 7-5 and 7-6 for amplification. The amplified signals are passed via the selector switches 10-9, 10—10, 10-3 and 10-4 to the speaker terminals 8-3, 8-4, 8-5 and 8-6 to be output therefrom. In this manner, 6.1 channel audio reproduction is performed in the first zone Zone 1.

Nextly, the operation in the case of m=2, i.e., when either one of the Zone 2 audio reproduction switch or the Zone3 audio reproduction switch is turned on will be described. When the Zone 2 audio reproduction switch is turned on, the control section 12$e$ enables the zone switching signal Z2ON as steps S5 and S6. When the zone switching signal Z2ON is enabled and the zone switching signal Z3ON is disabled, the selector switches 9-3 and 9-4 are caused to connect to the Z2 contact, the selector switches 9-5 and 9-6 are caused to connect to the Z1 contact, the selector switches 10-3, 10-4, 10-7, 10-8, 10-11, 10-12, 10-13 and 10-14 are turned off and the selector switches 10-5, 10-6, 10-9 and 10—10 are turned on as step S7. Analog audio signals (second audio signals) Z2L and Z2R applied to the input terminals 1-4 and 1-5 are processed in the same manner as in the fifth embodiment and two channel audio reproduction is performed in the second zone Zone 2.

When the zone switching signal Z2ON is enabled and the zone switching signal Z3ON is disabled, the switches 403$e$ and 404$e$ in the DSP 4$e$ are caused to connect to the Z2/Z3 contact and the switches 411$e$ and 412$e$ are caused to connect to the Z1 contact. Sound field correction thereby is performed on the main left and right signals L and R and the rear left and right signals RL and RR supplied to the first zone Zone 1 as step S8. The sound field correction in this case is the same as the one in the first embodiment. That is, the center signal C output from the sound field processing section 402$e$ is passed through the switch 403$e$ and adjusted to a proper level by an attenuator 405$e$ and thereafter is added to the main left and right signals L and R by adders 406$e$ and 407$e$. Likewise, the rear center signal RC output from the sound field processing section 402$e$ is passed through the switch 404$e$ and adjusted to a proper level by an attenuator 408$e$ and thereafter is added to the rear left and right signals RL and RR by adders 409$e$ and 410$e$.

The sound field corrected main left and right signals L and R are converted into analog signals by the D/A converter 5$e$ and thereafter are sent, via the volume controls 6-1 and 6-2, to the power amplifiers 7-1 and 7-2 for amplification. The amplified signals are output from the speaker terminals 8-1 and 8-2. The sound field corrected rear left and right signals RL and RR are converted into analog signals by the D/A converter 5$e$ and sent, via the volume controls 6-3 and 6-4, to the power amplifiers 7-3 and 7-4 for amplification. The amplified signals are sent, via the switches 10-9 and 10—10, to the speaker terminals 8-3 and 8-4 to be output therefrom.

The operation when the Zone3 audio reproduction switch is turned on will now be described. When the Zone3 audio reproduction switch is turned on, the control section 12$e$ enables the zone switching signal Z3ON as steps S5 and S6. When the zone switching signal Z3ON is enabled and the zone switching signal Z2ON is disabled, the selector switches 9-3 and 9-4 are caused to connect to the Z3 contact, the selector switches 9-5 and 0-6 are caused to connect to the Z1 contact, the selector switches 10-3, 10-4, 10-5, 19-6, 10-11, 10-12, 10-13 and 10-14 are turned off and the selector switches 10-7, 10-8, 10-9 and 10—10 are turned on as step S7. The analog audio signals (second audio signals) Z3L and Z3R are processed in the same manner as in the fifth embodiment and two-channel sound reproduction is performed in the second zone Zone3.

When the zone switching signal Z3ON is enabled and the zone switching signal Z2ON is disabled, the switches 403$e$ and 404$e$ in the DSP 4$e$ are caused to connect to the Z2/Z3 contact and the switches 411$e$ and 412$e$ are caused to connect to the Z1 contact as step S8. Sound field correction in this case is as described above.

The operation in the case of m=4, i.e., when the Zone 2 audio reproduction switch and the Zone3 audio reproduction switch are both turned on will now be described. When the Zone 2 audio reproduction switch and the Zone3 audio reproduction switch are both turned on, the control section 12$e$ enables the zone switching signals Z2ON and Z3ON as steps S5 and S6. When the zone switching signals Z2ON and Z3ON are enabled, the selector switches 9-3 and 9-4 are caused to connect to the Z2 or Z3 contact, the selector switches 9-5 and 9-6 are caused to connect to the Z3 or Z2 contact (to the Z3 contact when the switches 9-3 and 9-4 are connected to the Z2 contact and to the Z2 contact when the switches 9-3 and 9-4 are connected to the Z3 contact), and the selector switches 10-3, 10-4, 10-9 and 10—10 are turned off as step S7.

When the selector switches 9-3 and 9-4 connect to the Z2 contact and the selector switches 9-5 and 9-6 connect to the Z3 contact, the selector switches 10-7, 10-8, 10-11 and 10-12 are turned off and the selector switches 10-5, 10-6, 10-13 and 10-14 are turned on.

When the selector switches 9-3 and 9-4 connect to the Z3 contact and the selector switches 9-5 and 9-6 connect to the Z2 contact, the selector switches 10-5, 10-6, 10-13 and 10-14 are turned off and the selector switches 10-7, 10-8, 10-11 and 10-12 are turned on.

In a case where the Zone3 audio reproduction switch is turned on after the Zone 2 audio reproduction switch is turned on, since, as described previously, the selector switches 9-3 and 9-4 have already selected the Z2 contact at a time point when the Zone 2 audio reproduction switch is turned on, the selector switches 9-5 and 9-6 select the Z3 contact. In this case the analog audio signals Z2L and Z2R applied to the input terminals 1-4 and 1-5 are processed in the same manner as in the fifth embodiment and the analog audio signals Z3L and Z3R applied to the input terminals 1-6 and 1-7 are sent, via volume controls 6-14 and 6-15 and the selector switches 9-5 and 9-6, to the power amplifiers 7-3 and 7-4 for amplification and the amplified signals are sent, via the selector switches 10-13 and 10-14, to the speaker terminals 8-13 and 8-14 to be output therefrom.

In a case where the Zone 2 audio reproduction switch is turned on after the Zone3 audio reproduction switch is turned on, since, as described previously, the selector switches 9-3 and 9-4 have already selected the Z3 contact at a time point when the Zone3 audio reproduction switch is turned on, the selector switches 9-5 and 9-6 select the Z2 contact. In this case, the analog audio signals Z3L and Z3R applied to the input terminals 1-6 and 1-7 are processed in the same manner as in the fifth embodiment and the analog audio signals Z2L and Z2R applied to the input terminals 1-4 and 1-5 are sent, via volume controls 6-8 and 6-9 and the selector switches 9-5 and 9-6, to the power amplifiers 7-3 and 7-4 for amplification and the amplified signals are sent, via the selector switches 10-11 and 10-12, to the speaker terminals 8-7 and 8—8 to be output therefrom.

In a case where the Zone 2 audio reproduction switch and the Zone3 audio reproduction switch are turned on simultaneously from the off state, the control section 12$e$ causes the selector switches 9-3 and 9-4 to select the Z2 contact or the Z3 contact in accordance with a preset rule.

When the zone switching signals Z3ON and Z2ON are enabled, the switches 403$a$ and 404$e$ are caused to connect to the Z2/Z3 contact and the switches 411$e$ and 412$e$ are caused to connect to the Z2/Z3 contact. By this arrangement, for compensating reduction in the multichannel audio reproduction effect due to stoppage of supply of the rear left and right signals RL and RR, center signal C and rear center signal RC to the first zone Zone 1, sound field correction is performed on the main left and right signals L and R supplied to the first zone Zone 1 as step S8.

For realizing 6.1 channel multichannel audio reproduction by the main speaker SP-L and SP-R and the subwoofer SP-SW, it becomes necessary to distribute the rear left and right signals RL and RR, center signal C and rear center signal RC to the main left and right signals L and R. The center signal C output from the sound field processing section 402*e* is passed via the switch 403*e* to the attenuator 405*e* for proper adjustment in the level and thereafter is added to the main left and right signals L and R by adders 406*e* and 407*e*. The processing to this stage is the same as the one in the first embodiment.

Then, the rear left and right signals RL and RR added with the rear center signal RC are sent via the switches 411*e* and 412*e* to adders 406*e* and 407*e* for addition to the main left and right signals L and R. For outputting the rear left and right signals RL and RR added with the rear center signal RC from the main speakers SP-L and SP-R and localizing the sound image of these signals at positions of the rear speakers SP-RL and SP-RR, it is necessary to convert the frequency characteristic and delay time to those of a sound which is heard from behind. For this reason, the rear left and right signals RL and RR are added to the main left and right speakers L and R after the frequency characteristic and delay time are adjusted by suitable means, e.g., an unillustrated filter. Thus, by such so-called virtual sound field processing, the rear sound field can be realized only by the main speakers SP-L and SP-R.

In this manner, according to the present embodiment, an audio signal can be supplied to plural second zones from an audio reproduction apparatus incorporating power amplifiers of 2 (=6) channels. When audio reproduction is performed either in the second zone Zon2 or in Zone3, sound field correction is performed on the main left and right signals L and R and the rear left and right signals RL and RR by the DSP 4*e* in the same manner as in the fifth embodiment and, when audio reproduction is performed both in the second zones Zone 2 and Zone3 simultaneously, sound field correction is performed on the main left and right signals L and R by the DSP 4*e*. By this arrangement, reduction in the multichannel audio reproduction effect in the first zone Zone 1 can be compensated.

[Eighth Embodiment]

Figure 13:
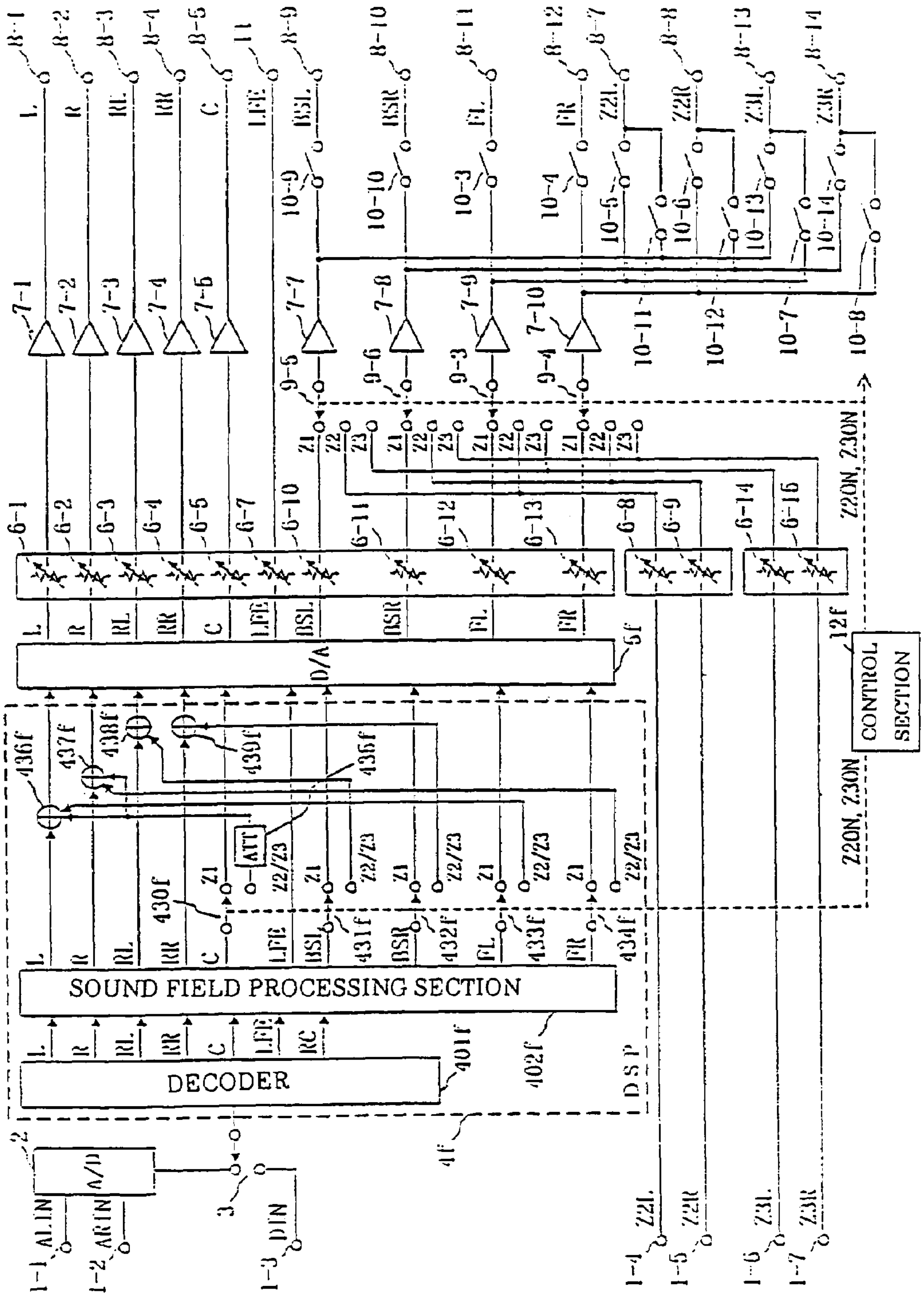
FIG. 13 is a block diagram showing a setup of an audio reproduction apparatus in accordance with an eighth embodiment of the present invention.

FIG. 13 is a block diagram showing a setup of an audio reproduction apparatus in accordance with an eighth embodiment of the present invention, where the same elements as in the embodiment of FIG. 9 are represented by the same reference characters as in FIG. 9. In the present embodiment, the present invention is applied to an audio reproduction apparatus incorporating power amplifiers of n (=9) channels.

A decoder 401*f* of a DSP 4*f* generates audio signals of main left and right signals L and R, rear left and right signals RL and RR, center signal C, rear center signal RC and subwoofer signal LFE on the basis of digital audio signals output from the selector 3.

A sound field processing section 402*f* outputs audio signals (first audio signals) of the main left and right signals L and R, rear left and right signals RL and RR, center signal C, subwoofer signal LFE, rear surround signals BSL and BSR, front left and right signals Ft and FR to a D/A converter 5*f*. At this time, the sound field processing section 402*f* generates the rear surround signals BSL and BSR on the basis of the rear center signal RC and also generates the front left and right signals FL and FR on the basis of the main left and right signals L and R, rear left and right signals RL and RR, center signal C and rear center signal RC. The D/A converter 5*f* converts the audio signals output from a DSP 4*f* to analog signals. Processing of the main left and right signals L and R, rear left and right signals RL and RR, center signal C and subwoofer signal LFE output from the D/A converter 5*f* is performed in the same manner as in the first embodiment.

Figure 14:
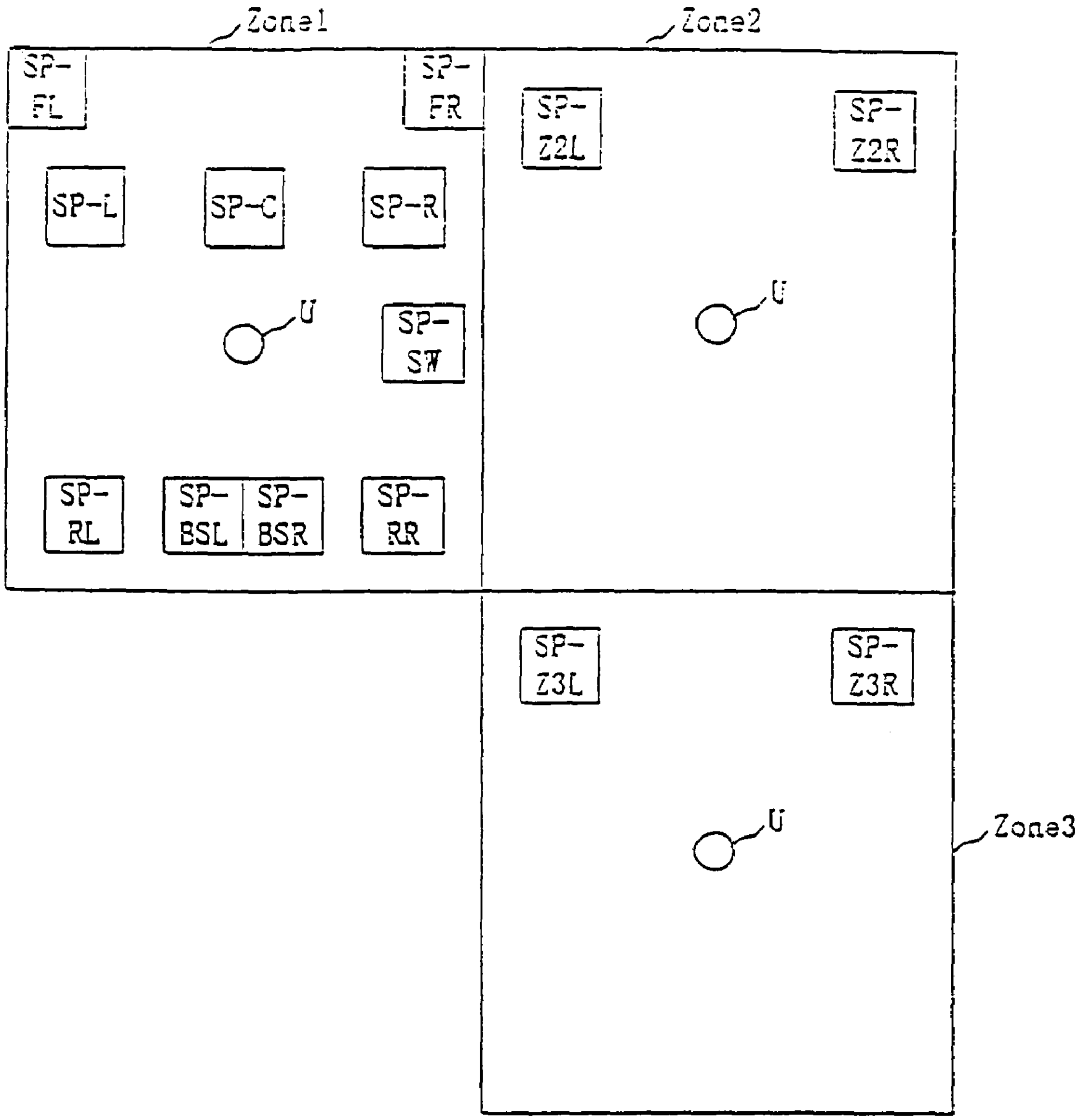
FIG. 14 is a plan view showing arrangement of speakers in a first zone and speakers in a second zone employed in the eighth embodiment of FIG. 13.

FIG. 14 shows speaker arrangement in the first zone Zone 1 and second zones Zone 2 and Zone3 in case the audio reproduction apparatus of FIG. 13 is employed. Respective speakers and connections of speaker terminals are the same as those in the first embodiment and the third to fifth embodiments.

Since processing performed when the Zone 2 audio reproduction switch and the Zone3 audio reproduction switch are turned on and off are performed in the same procedure as in the first embodiment, the operation of the present embodiment will be described with reference to FIG. 2.

When the Zone 2 audio reproduction switch and the Zone3 audio reproduction switch are both turned off, the control section 12*f* disables the zone switching signals Z2ON and Z3ON as steps S1 and S2 shown in FIG. 2. The operation of the selector switches 9-3 to 9-6 and the selector switches 10-3 to 10-14 when the zone switching signals Z2ON and Z3ON are disabled is the same as the one described previously with respect to the seventh embodiment as step S3.

By this operation, the rear surround signals BSL and BSR and front left and front right signals FL and FR output from the D/A converter 5*f* are sent via the volume controls 6-10, 6-11, 6-12 and 6-13 and the selector switches 9-5, 9-6, 9-3 and 9-4, to the power amplifiers 7—7, 7-8, 7-9 and 7-10 for amplification. The amplified signals are sent, via the selector switches 10-9, 10—10, 10-3 and 10-4, to the speaker terminals 8-9, 8-10, 8-11 and 8-12 to be output therefrom. In this manner, 9.1 channel audio reproduction is performed in the first zone Zone 1.

When the zone switching signals Z2ON and Z3ON are disabled, switches 430*f*,431*f*, 432*f*, 433*f* and 434*f* are caused to connect to the Z1 contact to turn off sound field correction to be described later (step S3).

The operation performed in the case of m=2, i.e., when either the Zone 2 audio reproduction switch or the Zone3 audio reproduction switch is turned on, will now be described. When the Zone 2 audio reproduction switch is turned on, the control section 12*f* enables the zone switching signal Z2ON as steps S5 and S6. The operation of the selector switches 9-3 to 9-6 and the selector switches 10-3 to 10-14 when the zone switching signal Z2ON is enabled and the zone switching signal Z3ON is diabled is the same as the one described previously with respect to the seventh embodiment (step S7). The analog signals Z2L and Z2R applied to the input terminals 1-4 and 1-5 are sent, via the volume controls 6-8 and 6-9 and the selector switches 9-3 and 9-4, to the power amplifiers 7-9 and 7-10 for amplification and the amplified signals are sent, via the selector switches 10-5 and 10-6, to the speaker terminals 8-7 and 8—8 to be output therefrom. Thus, two-channel audio reproduction is performed in the second zone Zone 2.

When the zone switching signal Z2ON is enabled and the zone switching signal Z3ON is disabled, the switches 433*f* and 434*f* in the DSP 4*f* are caused to connect to the Z2/Z3 contact and the switches 431*f* and 432*f* are caused to connect to the Z1 contact. Sound field correction thereby is performed on the main left and right signals L and R supplied to the first zone Zone 1 as step S8. Sound field correction in this case is the same as the one performed in the fourth embodiment. Namely, the front left and right signals FL and FR output from the sound field processing section 402*f* are sent, via the switches 433*f* and 434*f*, to adders 436*f* and 437*f* for addition to the main left and right signals L and R.

The operation when the Zone3 audio reproduction switch is turned on will now be described. When the Zone3 audio reproduction switch is turned on, the control section 12*f* enables the zone switching signal Z3ON as steps S5 and S6. The operation of the selector switches 9-3 to 9-6 and the selector switches 10-3 to 10-14 when the zone switching switch Z3ON is enabled and the zone switching signal Z2ON is disabled is the same as the one described with respect to the seventh embodiment (step S7). The analog audio signals Z3L and Z3R applied to the input terminals 1-6 and 1-7 are sent, via the volume controls 6-14 and 6-15 and the selector switches 9-3 and 9-4, to the power amplifiers 7-9 and 7-10 for amplification. The amplified signals are sent,via the selector switches 10-7 and 10-8, to the speaker terminals 8-13 and 8-14 to be output therefrom. Thus, two channel audio reproduction is performed in the second zone Zone3.

When the zone switching signal Z3ON is enabled and the zone switching signal Z2ON is diabled, the switches 433*f* and 434*f* in the DSP 4*f* are caused to connect to the Z2/Z3 contact and the switches 431*f* and 432*f* are caused to connect to the Z1 contact as step S8. Sound field correction in this case is the same as the one described previously.

The operation in the case of m=4, i.e., when the Zone 2 audio reproduction switch and the Zone3 audio reproduction switch are both turned on will now be described. When the Zone 2 audio reproduction switch and the Zone3 audio reproduction switch are both turned on, the control section 12*e* enables the zone switching signals Z2ON and Z3ON as steps S5 and S6. The operation of the selector switches 9-3 to 9-6 and the selector switches 10-3 to 10-14 when the zone switching signals Z2ON and Z3ON are enabled is the same as the one described with respect to the seventh embodiment (step S7).

When the Zone3 audio reproduction switch is turned on after the Zone 2 audio reproduction switch is turned on, as described with respect to the seventh embodiment, the selector switches 9-3 and 9-4 are caused to connect to the Z2 contact and the selector switches 9-5 and 9-6 are caused to connect to the Z3 contact. In this case, the analog audio signals Z2L and Z2R applied to the input terminals 1-4 and 1-5 are processed in the same manner as when the zone switching signal Z2ON only is enabled and the analog audio signals Z3L and Z3R applied to the input terminals 1-6 and 1-7 are sent, via the volume controls 6-14 and 6-15 and the selector switches 9-5 and 9-6, to the power apmplifiers 7—7 and 7-8 for amplification. The amplified signals are sent, via the selector switches 10-13 and 10-14, to the speaker terminals 8-13 and 8-14 to be output therefrom.

When the Zone 2 audio reproduction switch is turned on after the Zone3 audio reproduction switch is turned on, as described with respect to the seventh embodiment, the selector switches 9-3 and 9-4 are caused to connect to the Z3 contact and the selector switches 9-5 and 9-6 are caused to connect to the Z2 contact. In this case, the analog audio signals Z3L and Z3R applied to the input terminals 1-6 and 1-7 are processed in the same manner as when the zone switching signal Z3ON only is enabled and the analog audio signals Z2L and Z2R applied to the input terminals 1-4 and 1-5 are sent, via the volume controls 6-8 and 6-9 and the selector switches 9-5 and 9-6, to the power apmplifiers 7—7 and 7-8 for amplification. The amplified signals are sent, via the selector switches 10-11 and 10-12, to the speaker terminals 8-7 and 8—8 to be output therefrom.

When the Zone 2 audio reproduction switch and the Zone3 audio reproduction switch are both turned on from the off state, the control section 12*f* causes the selector switches 9-3 and 9-4 to select the Z2 contact or the Z3 contact in accordance with a predetermined rule.

When the zone switching signals Z3ON and Z2ON are enabled, the switches 431*f*, 432*f* 433*f* and 434*f* are caused to connect to the Z2/Z3 contact. By this arrangement, for compensating reduction in the multichannel audio reproduction effect due to stoppage of supply of the rear surround signals BSL and BSR and the front left and right signals FL and FR to the first zone Zone 1, sound field correction is performed on the main left and right signals L and R and rear left and right signals RL and RR supplied to the first zone Zone 1 as step S8.

The rear surround signals BSL and BSR output from the sound field processing section 402*f* are sent, via the switches 431*f* and 432*f*, to adders 438*f* and 439*f* for addition to the rear left and right signals RL and RR. The principle of this sound field correction is the same as the one in the third embodiment.

On the other hand, the front left and right signals FL and FR output from the sound field processing section 402*f* are sent, via the switches 433*f* and 434*f*, to adders 436*f* and 437*f* for addition to the main left and right signals L and R. The principle of this sound correction is the same as the one in the fourth embodiment.

As described in the foregoing, in the present embodiment, an audio signal can be distributed to plural second zones from an audio reproduction apparatus incorporating power amplifiers of n (=9) channels and, for compensating reduction in the multichannel audio reproduction effect in the first zone Zone 1, when audio reproduction is performed either in the second zone Zone 2 or Zone3, sound field correction is performed on the main left and right signals L and R by the DSP 4*f* while when audio reproduction is performed both in the second zones Zone 2 and Zone3 simultaneously, sound field correction is performed on the main left and right signals L and R and the rear left and right signals RL and RR by the DSP 4*f*.

In the present embodiment, in a case where an audio signal is supplied to either one of the second zones Zone 2 or Zone3, the power amplifiers 7-9 and 7-10 for the front left and right signals FL and FR are allotted to the second zone. Alternatively, the power amplifiers 7—7 and 7-8 for the rear surround signals BSL and BSR may be allotted to the second zone. The control section 12*f* determines which power amplifiers should be allotted to the second zone in accordance with the DSP program. For example, in the case of a DSP program which attaches much importance to moving of a sound image as in a movie viewing program, the control section 12*f* allots the power amplifiers 7-9 and 7-10 for the front left and right signals FL and FR to the second zone. The operation in this case is as described previously.

On the other hand, in the case of a DSP program such as a movie program which attaches much importance to sound field, the control section 12*f* allots the power amplifiers 7—7 and 7-8 for the rear surround signals BSL and BSR to the second zone.

In the case where the Zone 2 audio reproduction switch only is turned on and the power amplifiers 7—7 and 7-8 for the rear surround signals BSL and BSR are allotted to the second zone, the selector switches 9-5 and 9-6 are caused to connect to the Z2 contact, the selector switches 9-3 and 9-4 are caused to connect to the Z1 contact, the selector switches 10-3, 10-4, 10-11 and 10-12 are turned on, the selector switches 10-5, 10-6, 10-7, 10-8, 10-9, 10—10, 10-13 and 10-14 are turned off, and the switches 433*f* and 434*f* in the DSP 4*f* are caused to connect to the Z1 contact and the switches 431*f* and 432*f* of the DSP 4*f* are caused to connect to the Z2/Z3 contact.

In the case where the Zone3 audio reproduction switch only is turned on and the power amplifiers 7—7 and 7-8 for the rear surround signals BSL and BSR are allotted to the second zone, the selector switches 9-5 and 9-6 are caused to connect to the Z3 contact, the selector switches 9-3 and 9-4 are caused to connect to the Z1 contact, the selector switches 10-3, 10-4, 10-13 and 10-14 are turned on, the selector switches 10-5, 10-6, 10-7, 10-8, 10-9, 10—10, 10-11 and 10-12 are turned off, and the switches 433*f* and 434*f* in the DSP 4*f* are caused to connect to the Z1 contact and the switches 431*f* and 432*f* of the DSP 4*f* are caused to connect to the Z2/Z3 contact.

Namely, when either one of the Zone 2 audio reproduction switch or the Zone3 audio reproduction switch only is turned on and the power amplifiers 7—7 and 7-8 for the rear surround signals BSL and BSR are allotted to the second zone, sound field correction is performed on the rear left and right signals RL and RR.

Whereas, in the above-described first to eighth embodiments, analog audio signals Z2L, Z2R, Z3L and Z3R are input to the audio reproduction apparatus as signals to be delivered to the second zones Zone 2 and Zone3, the present invention is not so limited. For example, digital audio signals Z2L, Z2R, Z3L and Z3R may be input to the audio reproduction apparatus and converted into analog audio signals so as to be delivered to the second zones Zone 2 and Zone 3.

The sound field correction of the first zone Zone 1 in each of the first to eighth embodiments may be carried out in any desired manner other than the above-described. Further, because separate power amplifiers are allocated to the second zones Zone 2 and Zone3, if rear surround components can not be output from the rear speakers of the first zone Zone 1, the sound field correction may be carried out by so-called virtual sound field processing such that the rear sound fields can be reproduced by the front speakers alone.

[Ninth Embodiment]

Figure 17:
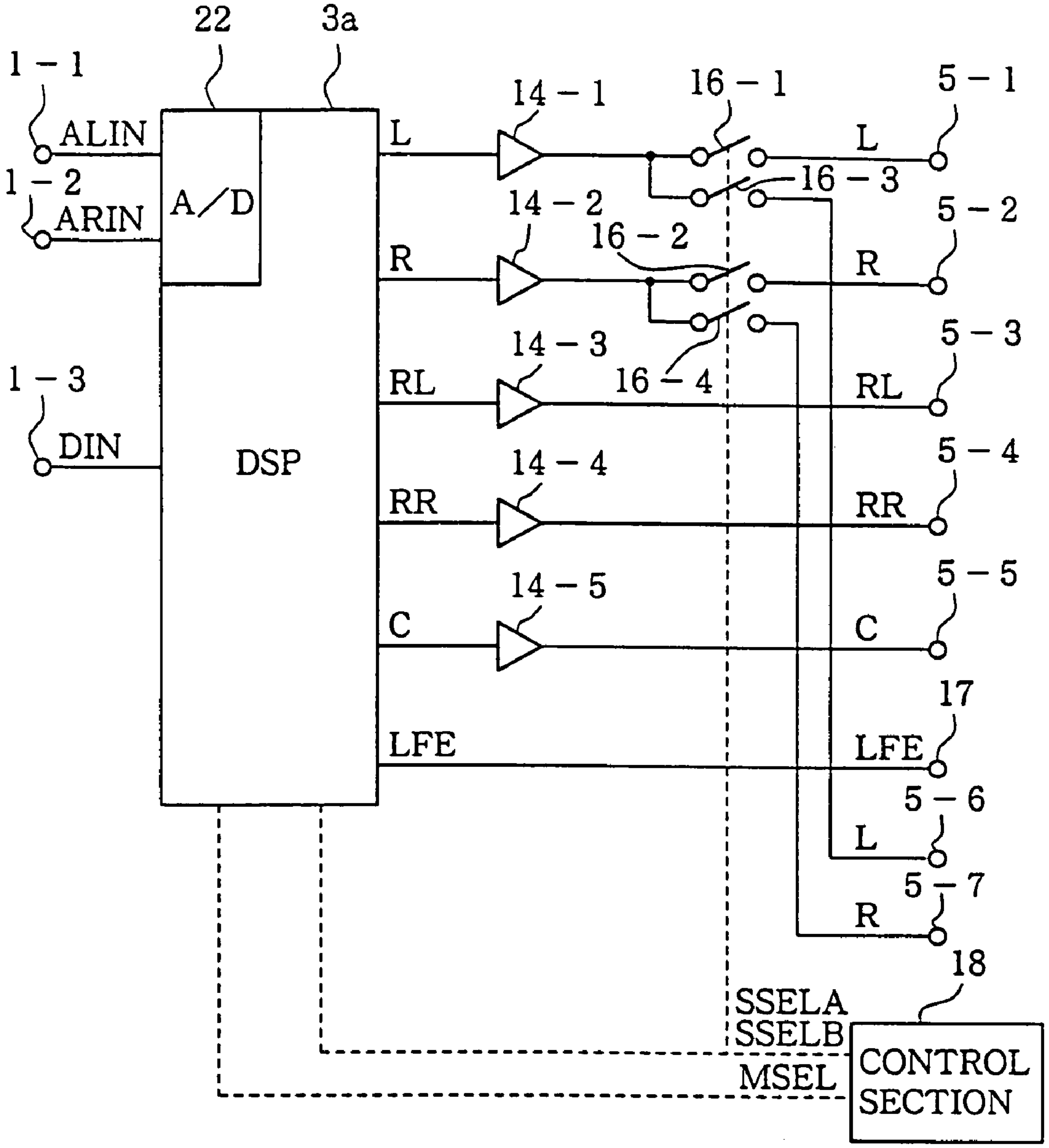
FIG. 17 is a block diagram showing a setup of an audio reproduction apparatus in accordance with a ninth embodiment of the present invention.

FIG. 17 is a block diagram showing a setup of an audio reproduction apparatus in accordance with a ninth embodiment of the present invention. The audio reproduction apparatus of FIG. 17 includes input terminals 1 (1—1, 1-2 and 1-3), an A/D converter 22, a DSP 3*a*, power amplifiers 14 (14-1, 14-2, 14-3, 14-4 and 14-5), speaker output terminals 5 (5-1, 5-2, 5-3, 5-4, 5—5, 5-6, and 5-7), main speaker changing switches 16 (16-1, 16-2, 16-3 and 16-4), a subwoofer output terminal 17, and a control section 18. For convenience of the following description, the main speaker changing switches 16-1 and 16-2 are referred to as "spA" switches, while the main speaker changing switches 16-3 and 16-4 are referred to as "spB" switches. In the instant embodiment, the control section 18 functions as a mode setting section for setting a place where main speakers of a B group are to be used. Further, the DSP 3*a* stops output or supply of surround signals when the output to main speakers of an A group is OFF (i.e., the spA switches are in an OFF state) and the output to main speakers of the B group is ON (i.e., the spB switches are in an ON state) and when a second zone ZoneB to be later described has been selected as a place where the B-group main speakers are to be positioned.

The embodiment of FIG. 17 is intended to perform 5.1-channel audio reproduction that is a typical example of the multichannel audio reproduction. When analog audio signals ALIN and ARIN of two channels are input to the input terminals 1—1 and 1-2, the A/D converter 22 converts the input analog audio signals ALIN and ARIN into digital audio signals. The thus-converted digital audio signals are passed to the DSP 3*a*, where the audio signals are subjected to sound field processing as may be necessary. However, a further description of these input signals is omitted because they are not multichannel audio inputs to be processed in accordance with the basic principles of the present invention. On the other hand, when a digital sound signal DIN, compression-coded by the Dolby Digital, DTS or AAC technique, is input to the input terminal 1-3, the DSP 3*a* decompression-decodes the input compression-coded digital sound signal DIN by means of an internal decoder (not shown), to thereby generate various analog audio signals, i.e. main left and right signals L and R, rear left and right signals RL and RR, center signal C and subwoofer signal LFE. When the DSP 3*a* is set to an OFF state (or downmix position), the main left and right signals L and R are output from the DSP 3*a*, but, when the DSP 3*a* is set to an ON state (or in a multichannel audio reproduction position), the main left and right signals L and R, rear left and right signals RL and RR, center signal C and subwoofer signal LFE are output from the DSP 3*a*.

Figure 27:
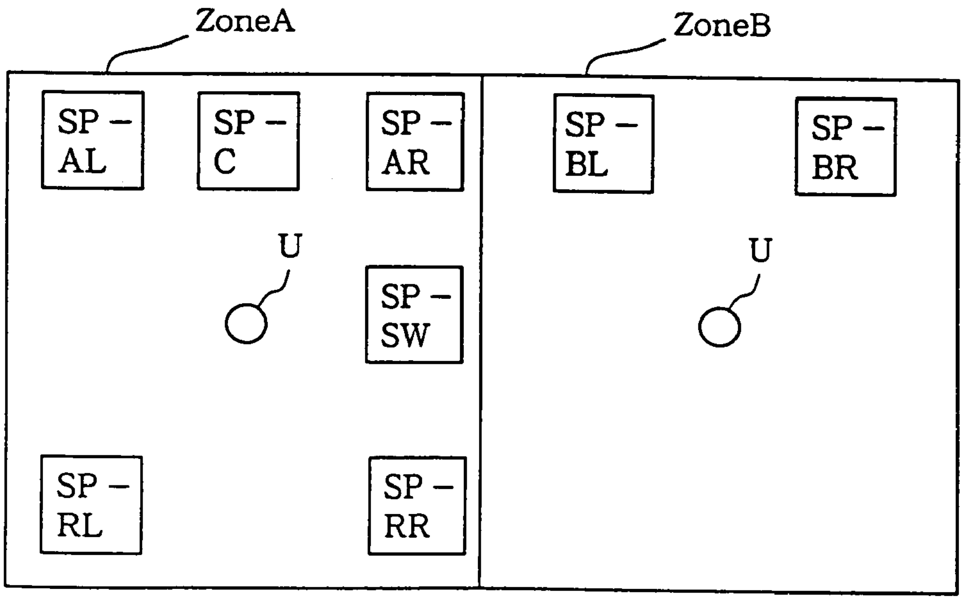
FIG. 27 is a plan view showing arrangement of speakers in a first zone for performing multichannel audio reproduction and in a second zone for performing two-channel audio reproduction in the conventional audio reproduction apparatus of FIG. 26.

For the ninth embodiment of FIG. 17, speakers are arranged in the first and second zones ZoneA and ZoneB in the same manner as shown in FIG. 27. The speaker output terminals 5-1, 5-2, 5-3, 5-4 and 5—5 are connected with main speakers SP-AL, SP-AR, rear speakers SP-RL, SP-RR and center speaker SP-C, respectively, in the first zone ZoneA, and the subwoofer output terminal 17 is connected with a subwoofer SP-SW provided with a built-in amplifier. Further, the speaker output terminals 5-6 and 5-7 are connected with main speakers SP-BL and SP-BR, respectively, in the second zone ZoneB.

The B-group main speakers may be positioned in either the first zone ZoneA or in the second zone ZoneB. Where the B-group main speakers are positioned in the second zone ZoneB, the user operates the audio reproduction apparatus to set a use mode of the B-group main speakers to "ZoneB", and the control section 18 enables a mode switching signal MSEL.

Further, in the case where the B-group main speakers SP-BL and SP-BR are positioned in the first zone ZoneA and an audio comparison or the like is to be made between outputs from the A-group main speakers SP-AL and SP-AR and the B-group main speakers SP-BL and SP-BR, the use mode of the B-group main speakers is set to "MAIN", and the control section 18 disenables the mode switching signal MSEL.

The following description will be made, assuming that the A-group main speakers SP-AL and SP-AR are positioned in the first zone ZoneA, the B-group main speakers SP-BL and SP-BR are positioned in the second zone ZoneB and the DSP 3*a* is in the ON state. In such a case, the spA and spB switches will take any one of four different combinations of ON/OFF states: the first one where the spA and spB switches are both ON, the second one where the spA switches are ON and the spB switches are OFF, the third one where the spA switches are OFF and the spB switches are ON; and the fourth one where the spA and spB switches are both OFF.

[In the case where the spA switches are ON and the spB switches are OFF]

Figure 18:
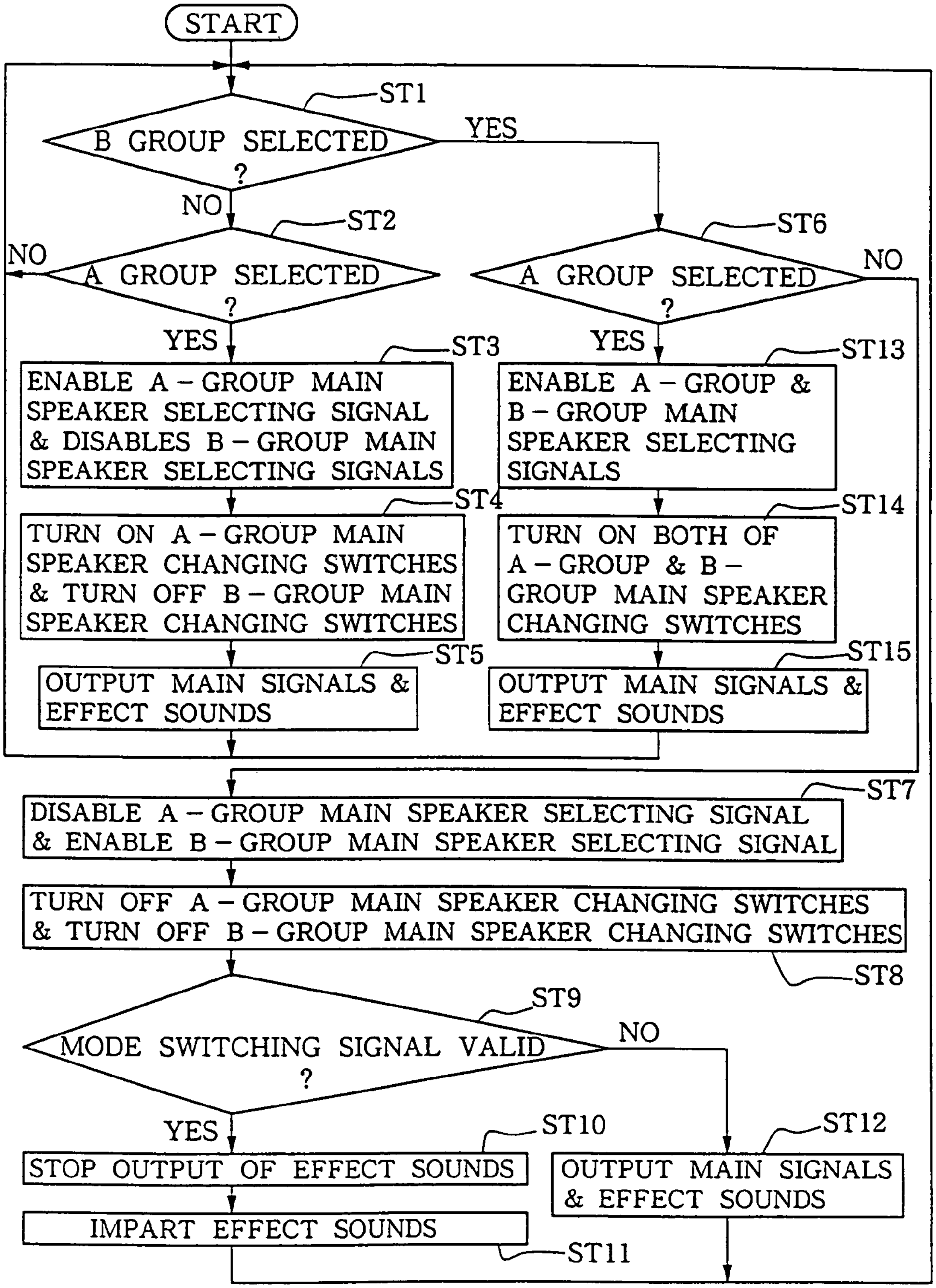
FIG. 18 is a flow chart showing operations performed by the audio reproduction apparatus of FIG. 17 as switching takes place between groups of main speakers.

When audio reproduction is to be executed using the A-group main speakers SP-AL and SP-AR positioned in the first zone ZoneA, the user depresses an A-group main speaker selecting switch (not shown). FIG. 18 is a flow chart showing operations performed by the audio reproduction apparatus of FIG. 17 as switching takes place between the A- and B-groups of the main speakers. If the A-group main speaker selecting switch has been depressed with a B-group main speaker selecting switch left undepressed (i.e., with a NO determination at step ST1 and YES determination at step ST2 of FIG. 10), the control section 18 enables an A-group main speaker selecting signal SSELA and disables a B-group main speaker selecting signal SSLEB, at step ST3.

As the A-group main speaker selecting signal SSELA is enabled, the A-group main speaker changing switches spA are turned on, and as the B-group main speaker selecting signal SSELB is disabled, the B-group main speaker changing switches spB are turned off (step ST4). Also, the DSP 3*a* outputs main left and right signals L and R, rear left and right signals RL and RR, center signal C and subwoofer signal LFE, at step ST5. The main left and right signals L, R, rear left and right signals RL, RR and center signal C, output from the DSP 3*a*, are amplified by the corresponding amplifiers 14-1, 14-2, 14-3, 14-4 and 14-5, and then output from the speaker output terminals 5-1, 5-2, 5-3, 5-4 and 5—5. Subwoofer signal LFE output from the subwoofer output terminal 17 is supplied to the subwoofer SP-SW provided with a built-in amplifier.

[In the case where the spA switches are OFF and the spB switches are ON]

When audio reproduction is to be executed in the second zone ZoneB, the user depresses the B-group main speaker selecting switch with the A-group main speaker selecting switch left undepressed. If the B-group main speaker selecting switch has been depressed with the A-group main speaker selecting switch left undepressed (i.e., with an YES determination at step ST1 and NO determination at step ST6 of FIG. 18), the control section 18 disables the A-group main speaker selecting signal SSELA and enables the B-group main speaker selecting signal SSLEB, at step ST7. As the A-group main speaker selecting signal SSELA is disabled like this, the A-group main speaker changing switches spA are turned off, and as the B-group main speaker selecting signal SSELB is enabled, the B-group main speaker changing switches spB are turned on (step ST8).

On the other hand, if the A-group main speaker selecting signal SSELA is invalid while the B-group main speaker selecting signal SSELB is valid (effective) and if the mode switching signal MSEL is valid (YES determination at step ST9), the DSP 3*a* stops output or supply of the individual surround signals, i.e. rear left and right signals RL and RR, center signal C and subwoofer signal LEF, at step ST10. Further, the DSP 3*a* imparts effect sounds to the main left and right signals L and R at step ST11. The main left and right signals L and R, having been imparted with the effect sounds, are amplified by the power amplifiers 14-1 and 14-2, respectively, and passed via the main speaker changing switches spB to the speaker output terminals 5-6 and 5-7, from which the main signals L and R are supplied to the B-group main speakers SP-BL and SP-BR.

The following paragraphs outline the concept of an effect sound impartment process performed on the main left and right signals L and R. To execute 5.1-channel multichannel audio reproduction via the main speakers SP-BL and SP-BR of two channels, there arises a need to allocate the rear left and right signals RL and RR, center signal C and subwoofer signal LFE to the main left and right signals L and R.

Namely, because it is only necessary that the center signal C, to be supplied to the center speaker SP-C, be localized between the main left and right signals L and R, the center signal C may be allocated and added to the main left and right signals L and R. Further, because sound image localization of the subwoofer signal LFE to be supplied to the subwoofer SP-SW does not matter so much, the subwoofer signal LFE may also be allocated and added to the main left and right signals L and R.

When the rear left and right signals RL and RR are to be output from the main speakers SP-BL and SP-BR and their sound images are to be localized at the positions of the rear speakers SP-RL and SP-RR, there arises a need to convert frequency characteristics and delay times of the audio signals into those of sounds that will be heard from behind the listening position (human listener). Namely, the user has empirically learned to presume directions and distances of sounds reaching the left and right ears on the basis of differences in their arrival times and frequency components; thus, in order to provide so-called virtual speakers, by which the rear left and right signals RL and RR are output from the main speakers SP-BL and SP-BR and their sound images are localized as if the sounds were reaching from behind the human listener, there is a need to process the rear left and right signals RL and RR so that the signals RL and RR have generally the same time differences and frequency components as when they are actually output from the rear speakers SP-RL and SP-RR, and then supply the thus-processed signals RL and RR to the main speakers SP-BL and SP-BR.

Figure 19:
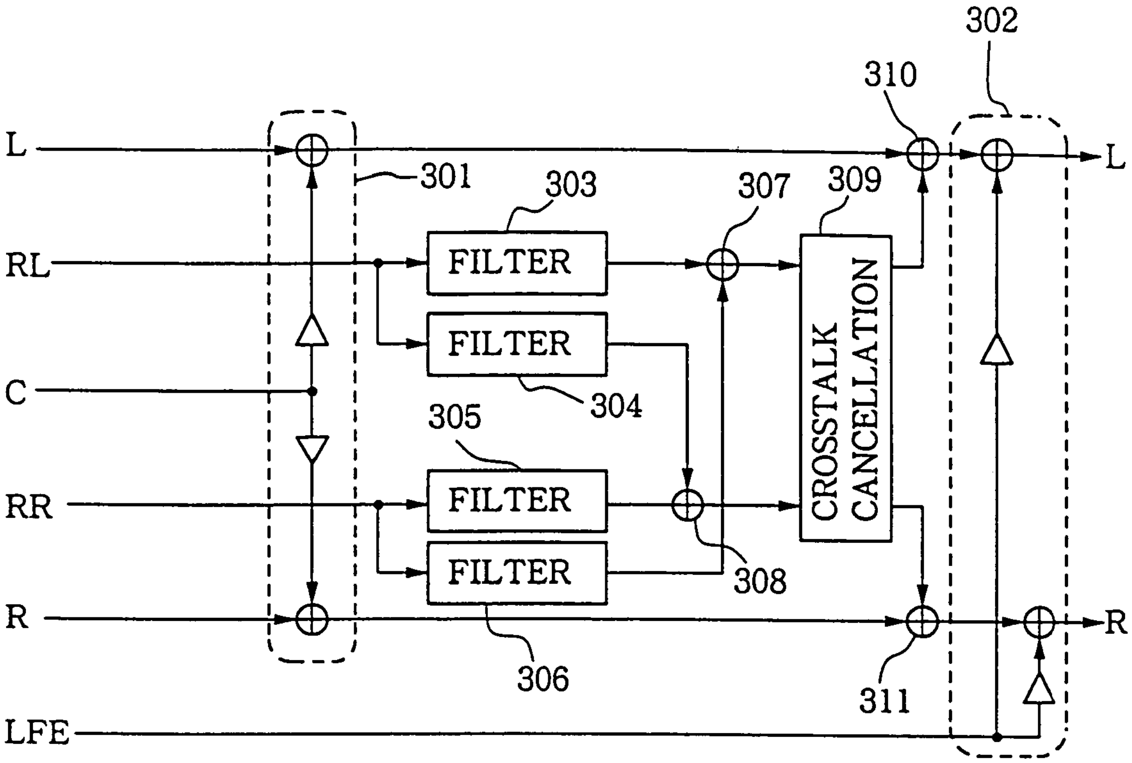
FIG. 19 is a block diagram showing an example of an effect sound impartment process performed by a DSP in the ninth embodiment of FIG. 17.

The following paragraphs describe details of the effect sound impartment process. FIG. 19 is a block diagram showing an example of the effect sound impartment process performed by the DSP 3*a* on the main left and right signals L and R. Note that FIG. 19 only diagramatically illustrates operations (functions) performed by the DSP 3*a*, not an actual structure of the DSP 3*a*. The center signal C is divided by an adder circuit 301, and the thus-divided signals are added to the main left and right signals L and R. Similarly, the subwoofer signal LFE is divided by an adder circuit 302, and the thus-divided signals are added to the main left and right signals L and R.

In a filter 303, there are preset filter coefficients for simulating, with a standard model of a user's head shape, a head-related transfer function, representative of a characteristic of an audio reaching the user's left year from the rear speaker SP-RL. Thus, the rear left signal RL is filtered in such a manner that the signal RL has generally the same time difference and frequency characteristic as when it is actually output from the rear speaker SP-RL to reach the user's left ear. Similarly, in a filter 304, there are preset filter coefficients for simulating, with the above-mentioned standard model, a head-related transfer function, representative of a characteristic of an audio reaching the user's right year from the rear speaker SP-RL. Thus, the rear signal RL is filtered in such a manner that the signal RL has generally the same time difference and frequency characteristic as when it is actually output from the rear speaker SP-RL to reach the user's right ear. Further, in a filter 305, there are preset filter coefficients for simulating, with the above-mentioned standard model, a head-related transfer function, representative of a characteristic of an audio reaching the user's right year from the rear speaker SP-RR. Thus, the rear signal RR is filtered in such a manner that the signal RR has generally the same time difference and frequency characteristic as when it is actually output from the rear speaker SP-RR to reach the user's right ear. Similarly, in a filter 306, there are preset filter coefficients for simulating, with the above-mentioned standard model, a head-related transfer function, representative of a characteristic of an audio reaching the user's left year from the rear speaker SP-RR. Thus, the rear signal RR is filtered in such a manner that the signal RR has generally the same time difference and frequency characteristic as when it is actually output from the rear speaker SP-RR to reach the user's left ear.

The rear left signal RL having been filtered by the filter 303 and the rear right signal RR having been filtered by the filter 306 are added by an adder 307 and then passed to a crosstalk cancellation circuit 309 for removal of an undesired crosstalk component, so that the signal having the crosstalk component removed therefrom is added to the main left signal L by an adder 310. The rear right signal RR having been filtered by the filter 305 and the rear signal RL having been filtered by the filter 304 are added by an adder 308 and then passed to the crosstalk cancellation circuit 309 for removal of an undesired crosstalk component, so that the signal having the crosstalk component removed therefrom is added to the main right signal R by an adder 311.

The DSP 3*a* outputs the main left and right signals L and R having been imparted with effect sounds in the above-described manner. The main left and right signals L and R output from the DSP 3*a* are supplied, via the corresponding 14-1 and 14-2, to the main speakers SP-BL and SP-BR.

As set forth above, the ninth embodiment of the present invention is arranged to stop the supply, to the first zone ZoneA, of the individual surround signals, i.e. rear left and right signals RL and RR, center signal C and subwoofer signal LEE, on condition that the B-group main speakers SP-BL and SP-BR are positioned in the second zone ZoneB, the use mode of the B-group main speakers is set to "ZoneB" and the output to the B-group main speakers is turned on with the output to the A-group main speakers set in the OFF state. Thus, the fifth embodiment can prevent unnecessary surround signals from being reproduced in the first zone ZoneA. Further, by imparting effect sounds to the main left and right signals L and R, the fifth embodiment can achieve realism (feeling of presence) in the multichannel audio reproduction, using the main speakers SP-BL and SP-BR of two channels positioned in the second zone ZoneB.

In the case where the spA switches are ON and the spB switches are ON

If the A-group and B-group main speaker selecting switches have both been depressed (i.e., with an YES determination at step ST1 and YES determination at step ST6 of FIG. 18), the control section 18 of the audio reproduction apparatus enables the A-group and B-group main speaker selecting signals SSELA and SSLEB, at step ST13. As the A-group and B-group main speaker selecting signals SSELA and SSLEB are disabled like this, the A-group and B-groups main speaker changing switches spA and spB are turned on at step ST14. The DSP 3*a* outputs the main left and right signals L and R, rear left and right signals RL and RR, center signal C and subwoofer signal LEF directly as they are, at step ST15. In this way, 5.1-channel audio reproduction is executed in the first zone ZoneA using the A-group main speakers SP-AL and SP-AR, rear speakers SP-RL and SP-RR, center speaker SP-C and subwoofer SP-SW, and simultaneously 2-channel audio reproduction is executed in the second zone ZoneB using the B-group main speakers SP-BL and SP-BR.

In the case where the spA switches are OFF and the spB switches are OFF

If neither the A-group main speaker selecting switches nor the B-group main speaker selecting switch has been depressed (i.e., with a NO determination at step ST1 and NO determination at step ST2 of FIG. 18), the control section 18 of the audio reproduction apparatus disables both of the A-group and B-group main speaker selecting signals SSELA and SSLEB, so that the main speaker changing switches spA and spB are turned off to output no audio.

The preceding paragraphs have described the case where the B-group main speakers are positioned in the second zone ZoneB. Needless to say, the B-group main speakers may be positioned in the first zone ZoneA together with the A-group main speakers. In such a case, the use mode of the B-group main speakers is set to "MAIN" as noted earlier. When the use mode of the B-group main speakers has been set to "MAIN", the DSP 3*a* outputs the main left and right signals L and R, rear left and right signals RL and RR, center signal C and subwoofer signal LEF directly as they are, irrespective of the place where the B-group main speakers are positioned. Therefore, the operations performed by the audio reproduction apparatus when the A-group and B-group main speakers are used simultaneously are similar to the operations of steps ST13–ST15 above, except that the B-group main speakers are positioned in the first zone ZoneA.

When the use mode of the B-group main speakers has been set to "MAIN" and only the B-group main speaker selecting button has been depressed, a NO determination is made at step ST9 of FIG. 18, so that the main left and right signals L and R, rear left and right signals RL and RR, center signal C and subwoofer signal LEF are supplied to the main speakers SP-BL and SP-BR, rear speakers SP-RL and SP-RR, center speaker SP-C and subwoofer SP-SW, at step ST12.

[Tenth Embodiment]

Figure 20:
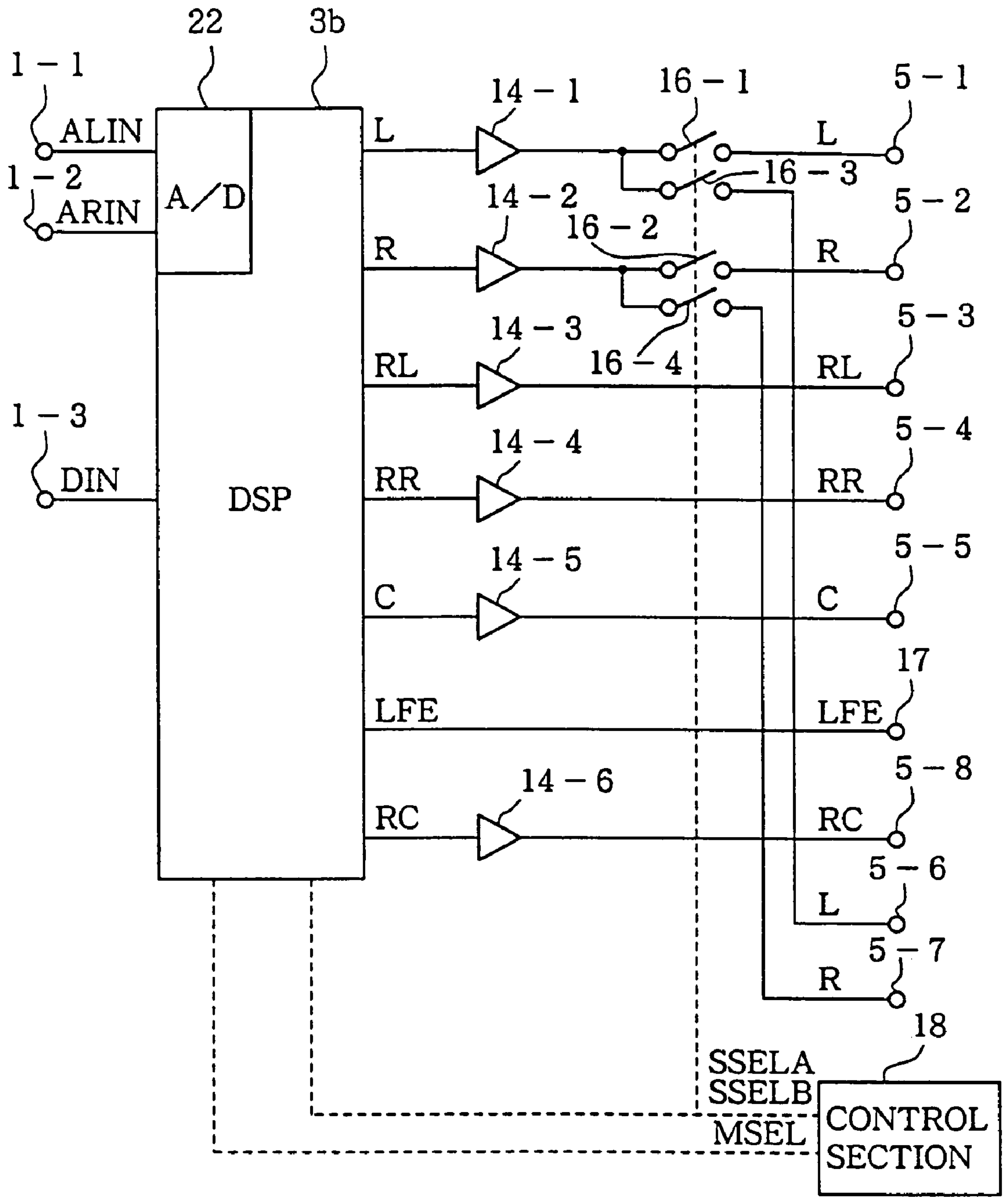
FIG. 20 is a block diagram showing a setup of an audio reproduction apparatus in accordance with a tenth embodiment of the present invention.

FIG. 20 is a block diagram showing an audio reproduction apparatus in accordance with a tenth embodiment of the present invention, where the same elements as in the embodiment of FIG. 17 are represented by the same reference characters as in FIG. 17. The tenth embodiment will be described below as an apparatus intended for 6.1-channel audio reproduction. On the basis of an input digital audio signal DIN, a DSP 3*b* of the apparatus generates various analog audio signals, i.e. main left and right signals L and R. rear left and right signals RL and RR, center signal C, subwoofer signal LFE and rear center signal RC. When the DSP 3*b* is in an OFF state (or downmix position), the main left and right signals L and R are output from the DSP 3*b*, but, when the DSP 3*b* is in an ON state, the main left and right signals L and R, rear left and right signals RL and RR, center signal C, subwoofer signal LFE and rear center signal RC are output from the DSP 3*b*.

Figure 21:
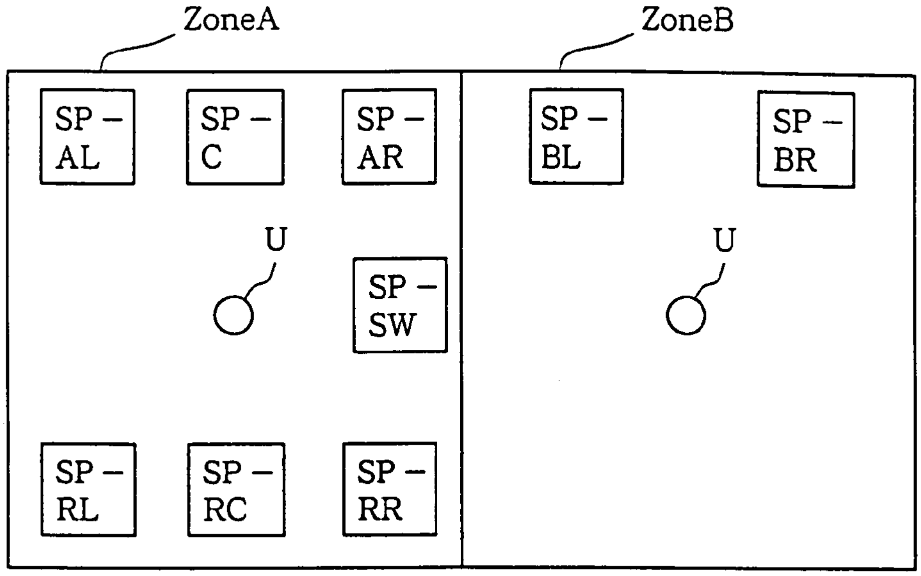
FIG. 21 is a plan view showing arrangement of speakers in first and second zones employed in the sixth embodiment FIG. 20.

FIG. 21 shows arrangement of speakers in the first and second zones ZoneA and ZoneB employed in the audio reproduction apparatus of FIG. 20. The arrangement of FIG. 21 is similar to that shown in FIG. 27, except that a rear center speaker SP-RC is added to the speakers in the first zone ZoneA. The speaker output terminal 5-8 is connected with the rear center speaker SP-RC.

Operations performed by the audio reproduction apparatus of FIG. 20 as switching takes place between the groups of the main speakers are similar to those described above in relation to the ninth embodiment, and therefore they will be described, with reference to FIG. 18, on the assumption that the A-group main speakers SP-AL and SP-AR are positioned in the first zone ZoneA, the B-group main speakers SP-BL and SP-BR are positioned in the second zone ZoneB and the DSP 3*b* is in the ON state.

If the A-group main speaker selecting switch has been depressed with the B-group main speaker selecting switch left undepressed (i.e., with a NO determination at step ST1 and YES determination at step ST2 of FIG. 10), the control section 18 enables the A-group main speaker selecting signal SSELA and disables the B-group main speaker selecting signal SSLEB, at step ST3. Consequently, the A-group main speaker changing switches spA are turned on, and the B-group main speaker changing switches spB are turned off (step ST4). Also, the DSP 3*b* outputs main left and right signals L and R, rear left and right signals RL and RR, center signal C, subwoofer signal LFE and rear center signal RC, at step ST5. The main left and right signals L, R, rear left and right signals RL, RR and center signal C and subwoofer signal LFE, output from the DSP 3*b*, are processed in the same manner as described above in relation to the fifth embodiment. The rear center signal RC output from the DSP 3*b* is amplified by the corresponding amplifier 14-6 and then output from the speaker output terminal 5-8. In this way, the 6.1-channel audio reproduction is executed in the first zone ZoneA.

If the B-group main speaker selecting switch has been depressed with the A-group main speaker selecting switch left undepressed (i.e., with an YES determination at step ST1 and NO determination at step ST6 of FIG. 10), the control section 18 disables the A-group main speaker selecting signal SSELA and enables the B-group main speaker selecting signal SSLEB, at step ST7. Consequently, the A-group main speaker changing switches spA are turned off, and the B-group main speaker changing switches spB are turned on (step ST8). If the A-group main speaker selecting signal SSELA is invalid while the B-group main speaker selecting signal SSELB is valid and if the mode switching signal MSEL is valid (YES determination at step ST9), the DSP 3*b* stops output of the individual surround signals, i.e. rear left and right signals RL and RR, center signal C, subwoofer signal LEF and rear center signal RC, at step ST10, and the DSP 3*b* imparts effect sounds to the main left and right signals L and R by an effect sound impartment process at step ST11.

At that time, the effect sound impartment process may include, in addition to the operations as described above in relation to the ninth embodiment, operations for processing the rear center signal RC to have generally the same time difference and frequency characteristic as when the sound actually reaches the user from the rear center speaker SP-RC and thereby supplying the thus-processed signal RC to the main speakers SP-BL and SP-BR.

Figure 22:
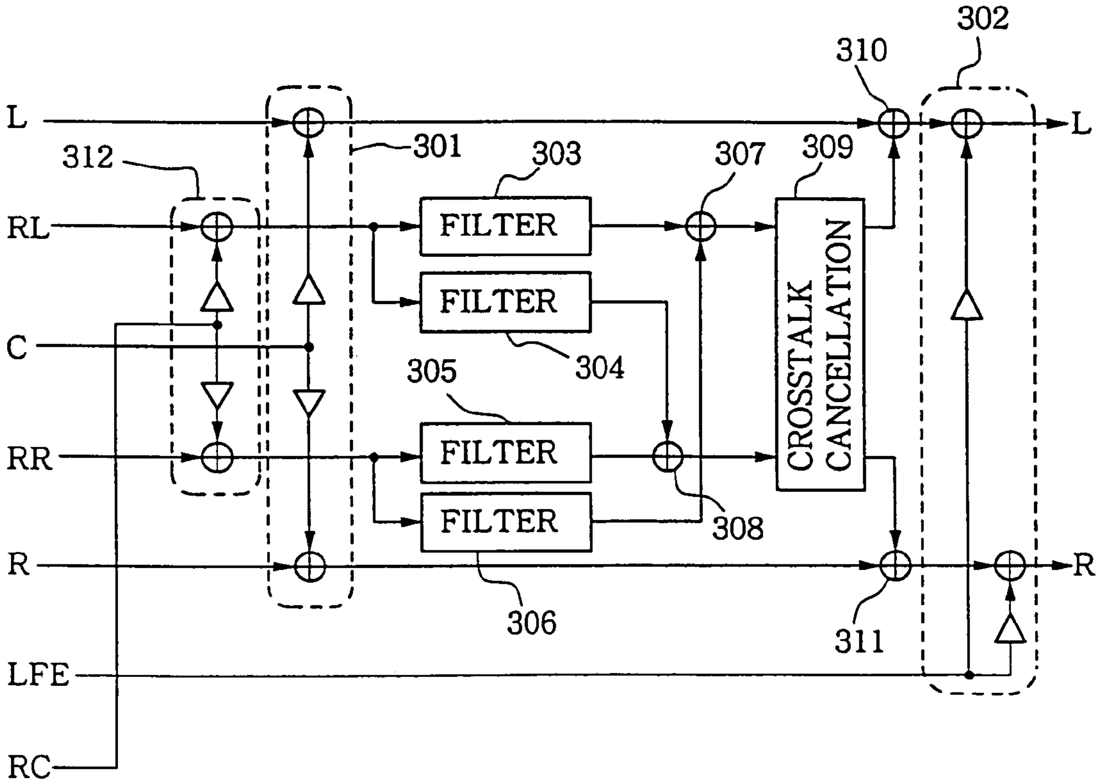
FIG. 22 is a block diagram showing an example of an effect sound impartment process performed by a DSP in the tenth embodiment FIG. 20.

FIG. 22 is a block diagram showing an example of the effect sound impartment process performed by the DSP 3*b* on the main left and right signals L and R, where the same operations as in the example of FIG. 19 are depicted by the same reference characters. Because it is only necessary that the rear center signal RC be localized between the rear left and right signals RL and RR, the signal RC may be allocated and added to the rear left and right signals RL and RR before a filter process. Namely, the rear center signal RC is divided by an adder circuit 312, and the thus-divided signals are added to the rear left and right signals RL and RR before the filter process. The rear left and right signals RL and RR, center signal C and subwoofer signal LEF are processed in the same manner as in the fifth embodiment. The DSP 3*b* outputs the main left and right signals L and R having been imparted with effect sounds in the above-described manner.

In this way, the sixth embodiment can achieve realism (feeling of presence) in the multichannel audio reproduction, using the main speakers SP-BL and SP-BR of two channels positioned in the second zone ZoneB.

Whereas the preceding paragraphs have described the sixth embodiment as using either one of the A-group and B-group main speakers, the A-group and B-group main speakers may be used simultaneously as in the ninth embodiment.

[Eleventh Embodiment]

Figure 23:
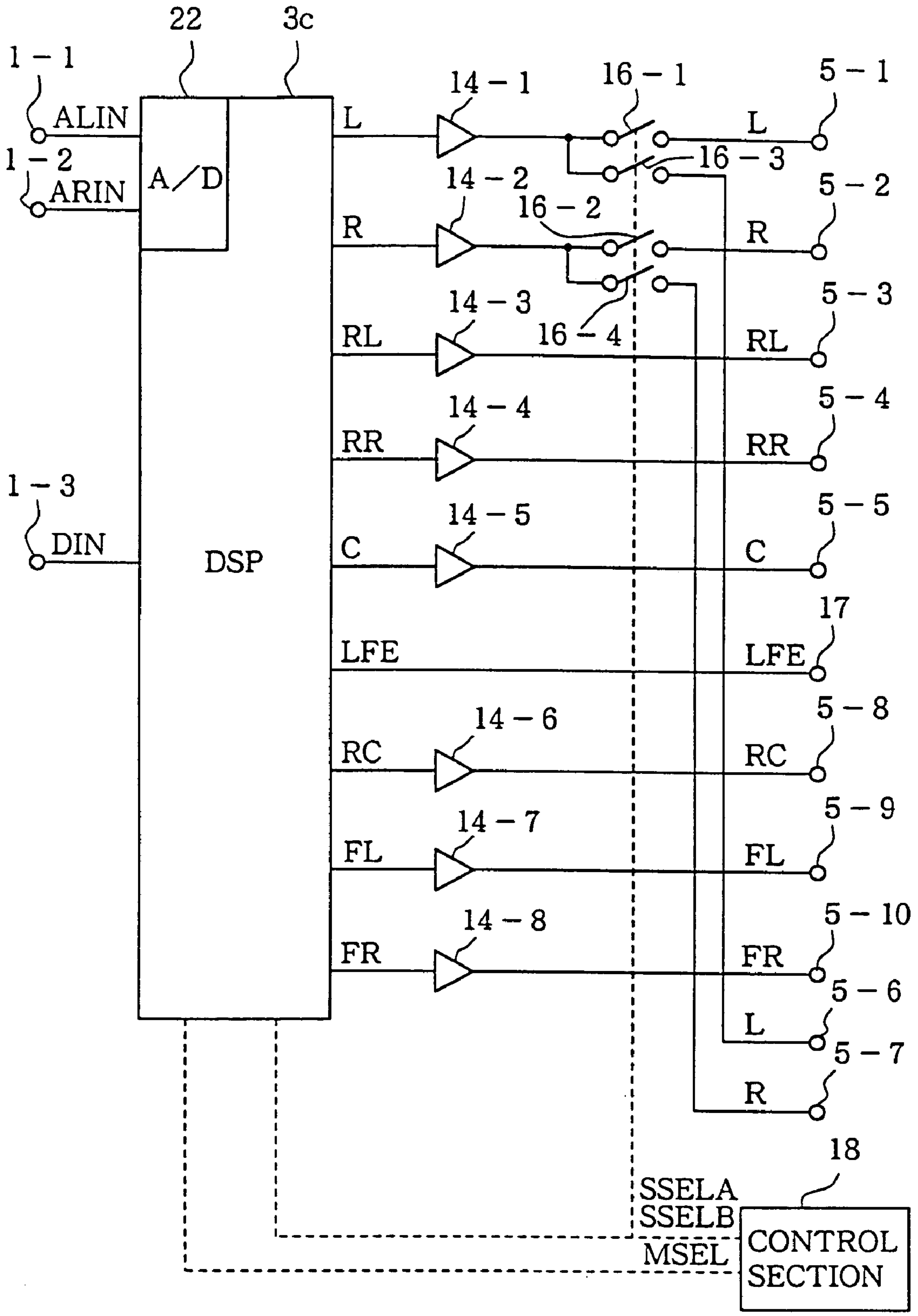
FIG. 23 is a block diagram showing an audio reproduction apparatus in accordance with an eleventh embodiment of the present invention.

FIG. 23 is a block diagram showing a setup of an audio reproduction apparatus in accordance with an eleventh embodiment of the present invention, where the same elements as in the embodiment of FIG. 20 are represented by the same reference characters as in FIG. 20. The eleventh embodiment will be described below as an apparatus intended for 8.1-channel audio reproduction. On the basis of an input digital audio signal DIN, a DSP 3*c* of the apparatus generates various analog audio signals, i.e. main left and right signals L and R, rear left and right signals RL and RR, center signal C, subwoofer signal LFE, rear center signal RC and front left and right signals FL and FR.

When the DSP 3*c* is in an OFF state (or downmix position), the main left and right signals L and R are output from the DSP 3*c*, but, when the DSP 3*b* is in an ON state, the main left and right signals L and R, rear left and right signals RL and RR, center signal C, subwoofer signal LFE, rear center signal RC and front left and right signals FL and FR are output from the DSP 3*b*.

Figure 24:
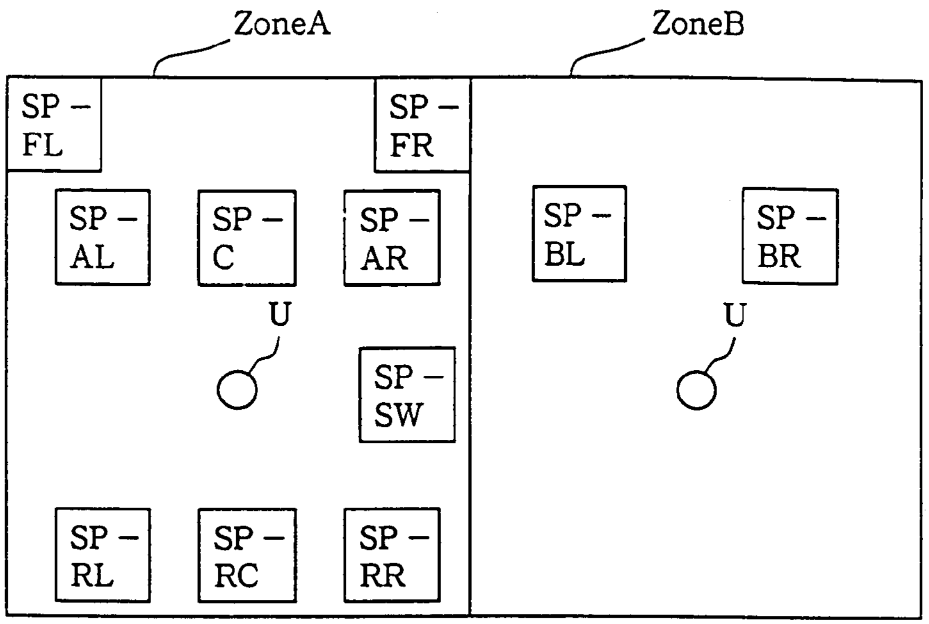
FIG. 24 is a plan view showing arrangement of speakers in first and second zones employed in the eleventh embodiment of FIG. 23.

FIG. 24 shows arrangement of speakers in the first and second zones ZoneA and ZoneB employed in the audio reproduction apparatus of FIG. 23. The arrangement of FIG. 24 is similar to that shown in FIG. 27, except that front speakers SP-FL and SP-FR are added to the speakers in the first zone ZoneA of FIG. 27. The speaker output terminals 5-9 and 5-10 are connected with the front speakers SP-FL and SP-FR. In this case, because the A-group and B-group main speakers are positioned in the different zones, the mode switching signal MSEL is enabled.

Operations performed by the audio reproduction apparatus of FIG. 23 as switching takes place between the groups of the main speakers are similar to those described above in relation to the ninth embodiment, and therefore they will be described, with reference to FIG. 18, on the assumption that the A-group main speakers SP-AL and SP-AR are positioned in the first zone ZoneA, the B-group main speakers SP-BL and SP-BR are positioned in the second zone ZoneB and the DSP 3*c* is in the ON state.

If the A-group main speaker selecting switch has been depressed with the B-group main speaker selecting switch left undepressed (i.e., with a NO determination at step ST1 and YES determination at step ST2 of FIG. 10), the control section 18 enables the A-group main speaker selecting signal SSELA and disables the B-group main speaker selecting, signal SSLEB, at step ST3. Consequently, the A-group main speaker changing switches spA are turned on, and the B-group main speaker changing switches spB are turned off (step ST4). The DSP 3*c* outputs main left and right signals L and R, rear left and right signals RL and RR, center signal C, subwoofer signal LFE, rear center signal RC and front left and right signals FL and FR, at step ST5. The main left and right signals L, R, rear left and right signals RL, RR, center signal C, subwoofer signal LFE and rear center signal RC, output from the DSP 3*c*, are processed in the same manner as in the tenth embodiment. The front left and right signals FL and FR output from the DSP 3*c* are amplified by the corresponding amplifiers 14-7 and 14-8 and then output from the speaker output terminals 5-9 and 5-10. In this way, the 8.1-channel audio reproduction is executed in the first zone ZoneA.

If, on the other hand, the B-group main speaker selecting switch has been depressed with the A-group main speaker selecting switch left undepressed (i.e., with an YES determination at step ST1 and NO determination at step ST6 of FIG. 18), the control section 18 disables the A-group main speaker selecting signal SSELA and enables the B-group main speaker selecting signal SSLEB, at step ST7. Consequently, the A-group main speaker changing switches spA are turned off, and the B-group main speaker changing switches spB are turned on (step ST8). If the A-group main speaker selecting signal SSELA is invalid and the B-group main speaker selecting signal SSELB is valid and if the mode switching signal MSEL is valid (YES determination at step ST9), the DSP 3*c* stops output of the individual surround signals, i.e. rear left and right signals RL and RR, center signal C, subwoofer signal LEF, rear center signal RC and front left and right signals FL and FR, at step ST10. Further, the DSP 3*c* imparts effect sounds to the main left and right signals L and R by an effect sound impartment process, at step ST11.

Figure 25:
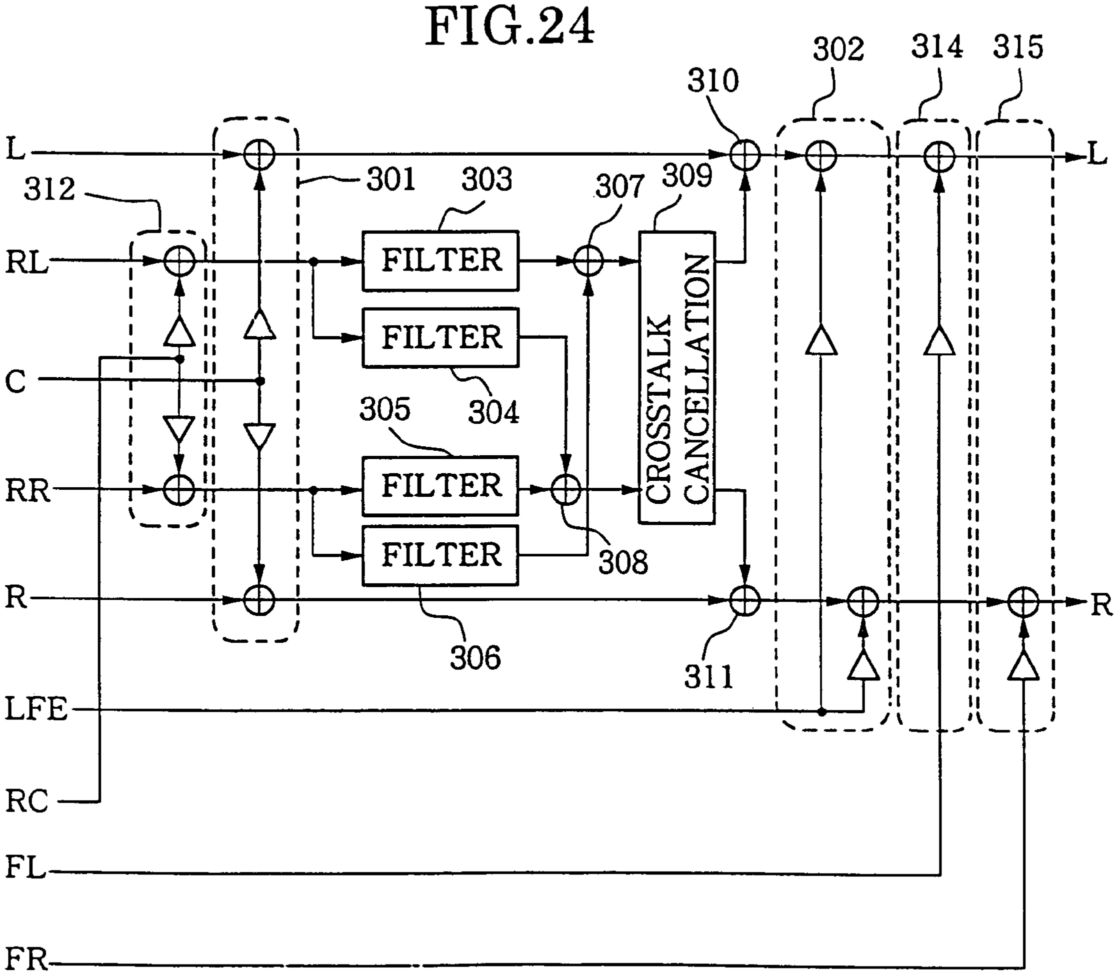
FIG. 25 is a block diagram showing an example of an effect sound impartment process performed by a DSP in the eleventh embodiment of FIG. 23.
Figure 26:
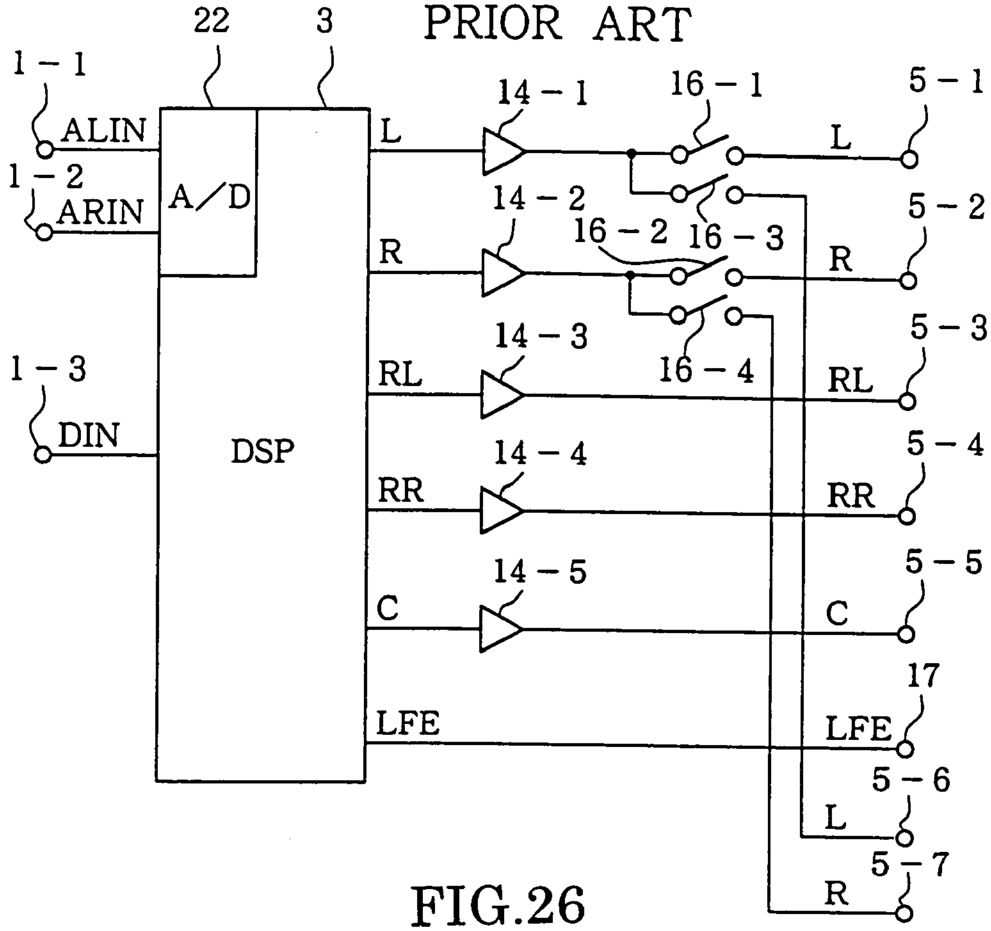
FIG.26 PRIOR ART
FIG. 26 is a block diagram illustrating a setup of another conventional audio reproduction apparatus.

At that time, the effect sound impartment process may include, in addition to the operations as described above in relation to the tenth embodiment, operations for adding the front left and right signals FL and FR to the main left and right signals L and R. FIG. 25 is a block diagram showing an example of the effect sound impartment process performed by the DSP 3*c* on the main left and right signals L and R, where the same operations as in the example of FIG. 22 are depicted by the same reference characters.

The front left signal FL is added to the main signal L by an adder 314, while the front right signal FR is added to the main signal R by an adder 315. The DSP 3*c* outputs the main left and right signals L and R having-been imparted with effect sounds in the above-described manner. In this way, the eleventh embodiment can achieve realism in the multichannel audio reproduction, using the main speakers SP-BL and SP-BR of two channels in the second zone ZoneB.

Whereas the preceding paragraphs have described the eleventh embodiment as using either one of the A-group and B-group main speakers, the A-group and B-group main speakers may be used simultaneously as in the ninth embodiment.

The present invention having been described above in relation to the ninth to eleventh embodiments can be summarized as follows.

The audio reproduction apparatus of the present invention is provided with the mode setting section that can selectively set usage of either one of the first mode where speakers connected to first speaker output terminals and speakers connected to second speaker output terminals are both positioned and used in the first zone, and the second mode where the speakers connected to the first speaker output terminals are positioned and used in the first zone and the speakers connected to the second speaker output terminals are positioned and used in the second zone. Thus, the present invention can achieve optimal audio reproduction corresponding to the usage of the speakers connected to the second speaker output terminal. When the output to the first speaker output terminals is off while the output to the second speaker output terminals is on and the second mode is selected by the mode setting section, the digital signal processor stops outputting the surround signals. With such arrangements, the present invention can prevent the unnecessary surround signals from being reproduced in the first zone.

Further, when the output to the first speaker output terminals is off while the output to the second speaker output terminals is on and the second mode is selected by the mode setting section, the digital signal processor imparts effect sounds to the main signals. With such arrangements, the present invention can achieve a so-called virtual speaker that allows sound images of rear signals to be localized in rear of a human listener, thereby accomplishing realism of multichannel audio reproduction using main speakers of two channels.

The present invention relates to the subject matter of Japanese Patent Application Nos. 2002-210528, 2002-215588 and 2003-201321 filed respectively on Jul. 19, 2002, Jul. 24, 2002 and Jul. 24, 2003, the disclosure of which is expressly incorporated herein by reference in its entirety.

What is claimed is:

1. An audio reproduction apparatus having: a first mode for performing multichannel audio reproduction to deliver first audio signals of n (n is an integral number in a range of $n \geqq 4$) channels from power amplifiers of the n channels to a first zone; and a second mode for performing multizone audio reproduction to deliver, from said power amplifier of m channel (m is an integral number in a range of $1 \leqq m < n$) not used for the multichannel audio reproduction, a second audio signal of the m channel to a second zone while performing multichannel audio reproduction to deliver said first audio signals of (n−m) channels from said power amplifiers of the (n−m) channels to said first zone, said audio reproduction apparatus comprising:

a digital signal processor that processes said first audio signals of the n channels and outputs the processed first audio signals to said power amplifiers of the n channels;

a first selector switch which, in said first mode, outputs to said power amplifier of the m channel said first audio signal of the m channel corresponding to said power amplifier of the m channel from among said first audio channels of the n channels outputted by said digital signal processor, while, in said second mode, outputs said second audio signal of the m channel to said power amplifier of the m channel; and a second selector switch which, in said first mode, couples the output of said power amplifier of the m channel to a first speaker terminal provided only for sound reproduction for said first zone, while, in said second mode, couples the output of said power amplifier of the m channel to a second speaker terminal provided only for sound reproduction for said second zone, wherein, in said second mode, said digital signal processor performs sound field correction on at least a portion of said first audio signals of the (n−m) channels so that a sound field of said first zone has a desired characteristic; and said first selector switch outputs, in said second mode in which only one of a plurality of second zones can be selected, said second audio signal of the m channel corresponding to said selected second zone to said power amplifier of the m channel.

2. An audio reproduction apparatus having: a first mode for performing multichannel audio reproduction to deliver first audio signals of n (n is an integral number in a range of $n \geqq 4$) channels from power amplifiers of the n channels to a first zone; and a second mode for performing multizone audio reproduction to deliver, from said power amplifier of m channel (m is an integral number in a range of $1 \leqq m<n$) not used for the multichannel audio reproduction, a second audio signal of the m channel to a second zone while performing multichannel audio reproduction to deliver said first audio signals of (n−m) channels from said power amplifiers of the (n−m) channels to said first zone, said audio reproduction apparatus comprising:

a digital signal processor that processes said first audio signals of the n channels and outputs the processed first audio signals to said power amplifiers of the n channels;

a first selector switch which, in said first mode, outputs to said power amplifier of the m channel said first audio signal of the m channel corresponding to said power amplifier of the m channel from among said first audio channels of the n channels outputted by said digital signal processor, while, in said second mode, outputs said second audio signal of the m channel to said power amplifier of the m channel;

a second selector switch which, in said first mode, couples the output of said power amplifier of the m channel to a speaker terminal provided for said first zone, while, in said second mode, couples the output of said power amplifier of the m channel to a speaker terminal provided for said second zone; and a control section which, in said second mode in which one or more zones can be selected from among a plurality of second zones, determines said power amplifier totaling the m channel corresponding to said selected second zone from among said power amplifiers of the n channels in accordance with a DSP program, wherein, in said second mode, said digital signal processor performs sound field correction on at least a portion of said first audio signals of the (n−m) channels so that a sound field of said first zone has a desired characteristic;

said first selector switch outputs, in said second mode, said second audio signal of the m channel corresponding to said selected second zone to said power amplifier of the m channel which has been determined by said control section; and said second selector switch couples, in said second mode, the output of said power amplifier of the m channel which has been determined by said control section to a speaker terminal provided for said selected second zone.

3. An audio reproduction apparatus having: a first mode for performing multichannel audio reproduction to deliver first audio signals of n (n is an integral number in a range of $n \geqq 4$) channels from power amplifiers of the n channels to a first zone; and a second mode for performing multizone audio reproduction to deliver, from said power amplifier of m channel (m is an integral number in a range of $1 \leqq m<n$) not used for the multichannel audio reproduction, a second audio signal of the m channel to a second zone while performing multichannel audio reproduction to deliver said first audio signals of (n−m) channels from said power amplifiers of the (n−m) channels to said first zone, said audio reproduction apparatus comprising:

a digital signal processor that processes said first audio signals of the n channels and outputs the processed first audio signals to said power amplifiers of the n channels;

a first selector switch connected to an input of said power amplifier of the m channel, wherein, in said first mode, said first selector switch selects said first audio signal of the m channel corresponding to said power amplifier of the m channel from among said first audio channels of the n channels outputted by said digital signal processor, while, in said second mode, said first selector switch selects said second audio signal of the m channel; and a second selector switch connected to an output of said power amplifier of the m channel, wherein, in said first mode, said second selector switch couples the output of said power amplifier of the m channel to a first speaker terminal only provided for sound reproduction for said first zone, while, in said second mode, said second selector switch couples the output of said power amplifier of the m channel to a second speaker terminal only provided for sound reproduction for said second zone, wherein, in said second mode, said digital signal processor performs sound field correction on at least a portion of said first audio signals of the (n−m) channels so that a sound field of said first zone has a desired characteristic.

4. An audio reproduction apparatus as claimed in claim 3 wherein a particular volume control is shared between sound volume adjustment of said first audio signal of the m channel and sound volume adjustment of said second audio signal of the m channel.

5. An audio reproduction apparatus having: a first mode for performing multichannel audio reproduction to deliver first audio signals of n (n is an integral number in a range of $n \geqq 4$) channels from power amplifiers of the n channels to a first zone; and a second mode for performing multizone audio reproduction to deliver, from said power amplifier of m channel (m is an integral number in a range of $1 \leqq m<n$) not used for the multichannel audio reproduction, a second audio signal of the m channel to a second zone while performing multichannel audio reproduction to deliver said first audio signals of (n−m) channels from said power amplifiers of the (n−m) channels to said first zone, said audio reproduction apparatus comprising:

a digital signal processor that processes said first audio signals of the n channels and outputs the processed first audio signals to said power amplifiers of the n channels;

a first selector switch connected to an input of said power amplifier of the m channel, wherein, in said first mode, said first selector switch selects said first audio signal of the m channel corresponding to said power amplifier of the m channel from among said first audio channels of the n channels outputted by said digital signal processor, while, in said second mode, said first selector switch selects said second audio signal of the m channel;

a second selector switch connected to an output of said power amplifier of the m channel, wherein, in said first mode, said second selector switch couples the output of said power amplifier of the m channel to a sneaker terminal provided for said first zone, while, in said second mode, said second selector switch couples the output of said power amplifier of the m channel to a speaker terminal provided for said second zone, wherein, in said second mode, said digital signal processor performs sound field correction on at least a portion of said first audio signals of the (n−m) channels so that a sound field of said first zone has a desired characteristic; and a control section that, as switching takes place from said first mode to said second mode, stores a current value of volume control of the m channel, having been adjusted to a sound volume of said first audio signal, as a volume value for said first zone and sets a prestored volume value for said second zone in the volume control of the m channel, but, as switching takes place from said second mode to said first mode, stores a current value of said volume control of the m channel, having been adjusted to a sound volume of said second audio signal, as a volume value for said second zone and sets a prestored volume value for said first zone in the volume control of the m channel.

* * * * *